(12) United States Patent
Li et al.

(10) Patent No.: US 12,230,194 B2
(45) Date of Patent: Feb. 18, 2025

(54) DISPLAY PANEL AND DISPLAY DEVICE

(71) Applicant: Xiamen Tianma Display Technology Co., Ltd., Xiamen (CN)

(72) Inventors: Chengxu Li, Xiamen (CN); Xiangyuan Li, Xiamen (CN); Jingzhu Li, Xiamen (CN); Bing Wang, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/380,428

(22) Filed: Oct. 16, 2023

(65) Prior Publication Data
US 2024/0038151 A1 Feb. 1, 2024

(30) Foreign Application Priority Data
Jun. 29, 2023 (CN) .......................... 202310791870.4

(51) Int. Cl.
*G09G 3/32* (2016.01)

(52) U.S. Cl.
CPC ....... *G09G 3/32* (2013.01); *G09G 2300/0842* (2013.01); *G09G 2310/0286* (2013.01); *G09G 2330/021* (2013.01)

(58) Field of Classification Search
CPC ............. H10K 59/131; H10K 59/1216; H10K 59/1213; G09G 3/32; G09G 2330/021; G09G 2300/0861; G09G 2310/0251; G09G 2300/0842; G09G 2300/0426; G09G 3/3233; G09G 3/3266; G09G 2310/0286; G09G 2300/0819; H01L 27/1255; H01L 27/1225; H01L 27/12
See application file for complete search history.

(56) References Cited

U.S. PATENT DOCUMENTS

| | | | | |
|---|---|---|---|---|
| 9,000,424 B2* | 4/2015 | Moon | ................... | H10K 50/805 257/40 |
| 10,074,314 B2* | 9/2018 | Lee | ...................... | H10K 59/1315 |
| 10,672,849 B2* | 6/2020 | Lee | ................... | H01L 29/41733 |
| 11,056,509 B2* | 7/2021 | Je | .......................... | H10K 59/131 |
| 11,574,978 B2* | 2/2023 | Li | .......................... | G09G 3/3275 |
| 11,765,935 B2* | 9/2023 | Cho | .................... | H10K 59/1216 257/40 |
| 11,871,616 B2* | 1/2024 | Noh | .................... | H10K 59/1216 |
| 11,882,730 B2* | 1/2024 | Li | ...................... | H10K 59/1216 |
| 2015/0097172 A1* | 4/2015 | Han | ...................... | H01L 27/1288 257/43 |
| 2022/0384558 A1* | 12/2022 | Xu | ........................ | H10K 59/131 |
| 2023/0329047 A1* | 10/2023 | Chang | ................. | H01L 27/1251 |
| 2023/0354660 A1* | 11/2023 | Li | .......................... | H10K 59/131 |
| 2024/0008308 A1* | 1/2024 | Choi | .................. | H01L 29/78633 |

(Continued)

*Primary Examiner* — Vinh T Lam
(74) *Attorney, Agent, or Firm* — KDW Firm PLLC

(57) ABSTRACT

Provided are a display panel and a display device. The display panel includes a substrate and a drive circuit disposed on one side of the substrate. The drive circuit includes a first transistor. The first transistor includes a first active layer. The first active layer includes an oxide semiconductor. The drive circuit also includes a first capacitor. One capacitor plate of the first capacitor is disposed in the same layer as the first active layer. In the display panel according to embodiments of the present disclosure, a substrate of a first capacitor in a drive circuit is disposed in the same layer as an active layer of an oxide semiconductor.

20 Claims, 21 Drawing Sheets

(56) References Cited

U.S. PATENT DOCUMENTS

2024/0055437 A1\* 2/2024 Lai .................. G09G 3/3241
2024/0063228 A1\* 2/2024 Lai .................. H01L 27/1251
2024/0164162 A1\* 5/2024 Chai ................. H10K 59/131

\* cited by examiner

340

350

360

10            Emit

330            Emit

10

330

10

330

DISPLAY PANEL AND DISPLAY DEVICE

CROSS-REFERENCE TO RELATED APPLICATIONS

This application claims priority to Chinese patent application No. 202310791870.4 filed with the China National Intellectual Property Administration (CNIPA) on Jun. 29, 2023, the disclosure of which is incorporated herein by reference in its entirety.

TECHNICAL FIELD

The present disclosure relates to the technical field of display panels, in particular, a display panel and a display device.

BACKGROUND

With the continuous development of display technology, display panels have been widely applied in production and daily life. However, there are still some technical problems with the display panels in related art that need urgent improvement.

SUMMARY

Embodiments of the present disclosure provide a display panel and a display device, in which a plate of a first capacitor in a drive circuit is disposed in the same layer as an active layer of an oxide semiconductor. In this manner, the process for manufacturing the display panel can be reduced, and a thinning design of the display panel as a whole can be better achieved.

Embodiments of the present disclosure provide a display panel. The display panel includes a substrate and a drive circuit located on one side of the substrate.

The drive circuit includes a first transistor. The first transistor includes a first active layer. The first active layer includes an oxide semiconductor.

The drive circuit also includes a first capacitor. One capacitor plate of the first capacitor is disposed in the same layer as the first active layer.

Embodiments of the present disclosure provide a display device. The display device includes the display panel described above.

BRIEF DESCRIPTION OF DRAWINGS

To illustrate technical schemes in embodiments of the present disclosure more clearly, accompanying drawings used in the description of the embodiments are briefly described below. Apparently, the accompanying drawings described below illustrate part of embodiments of the present disclosure, and those of ordinary skill in the art may obtain other accompanying drawings based on the accompanying drawings described below on the premise that no creative work is done.

DETAILED DESCRIPTION

The technical schemes in embodiments of the present disclosure are described clearly and completely in conjunction with drawings in the embodiments of the present disclosure from which the schemes are better understood by those skilled in the art. Apparently, the embodiments described below are part, not all, of the embodiments of the present disclosure. Based on the embodiments described herein, all other embodiments obtained by those skilled in the art on the premise that no creative work is done are within the scope of the present disclosure.

It is to be noted that terms such as "first" and "second" in the description, claims, and drawings of the present disclosure are used to distinguish between similar objects and are not necessarily used to describe a particular order or sequence. It should be understood that data used in this manner are interchangeable where appropriate so that the embodiments of the present disclosure described herein may also be implemented in a sequence not illustrated or described herein. In addition, terms "comprising", "including", and any other variations thereof are intended to encompass a non-exclusive inclusion. For example, a system, product, or device that includes a series of units not only includes expressly listed steps or units, but may also include other units that are not expressly listed or are inherent to such a product or device.

Figure 1:
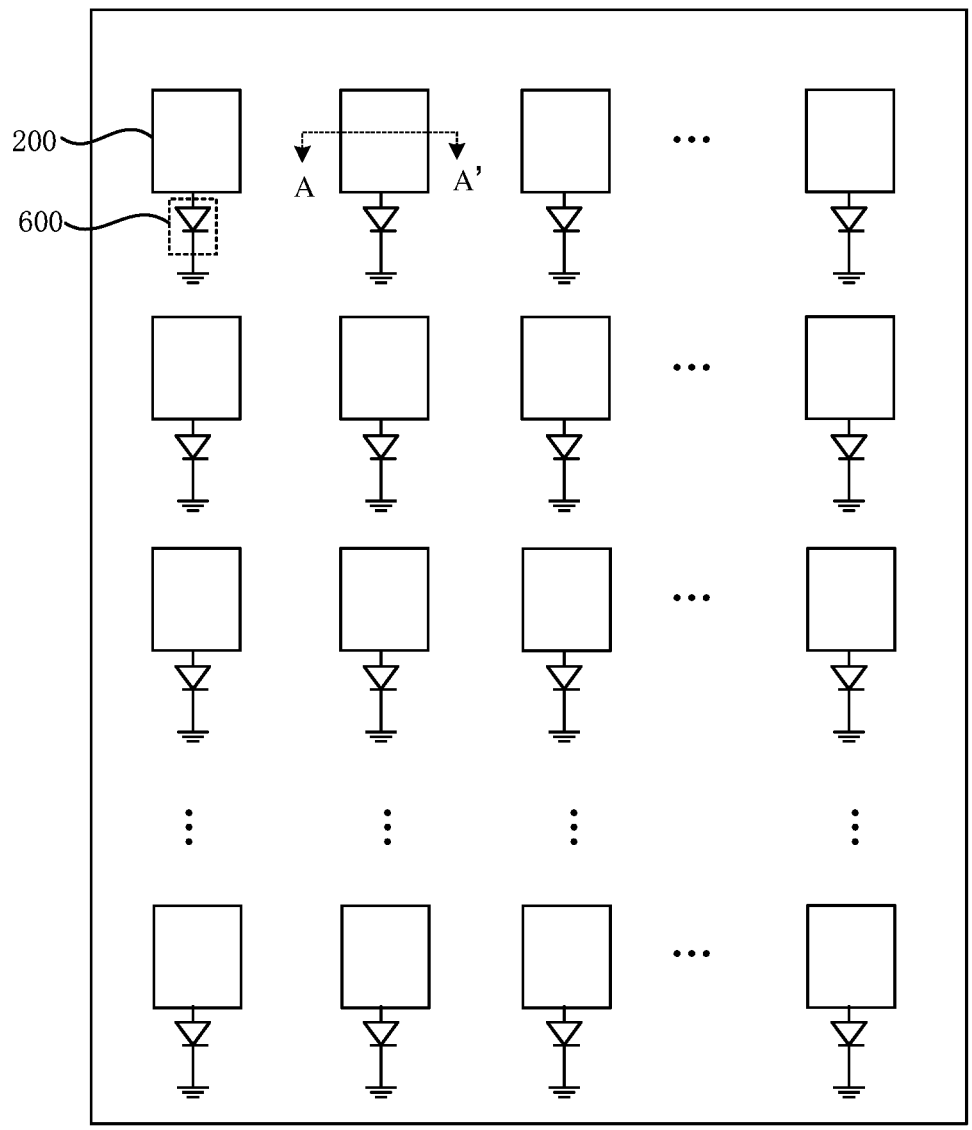
FIG. 1 is a schematic diagram illustrating the structure of a display panel according to an embodiment of the present disclosure.
Figure 2:
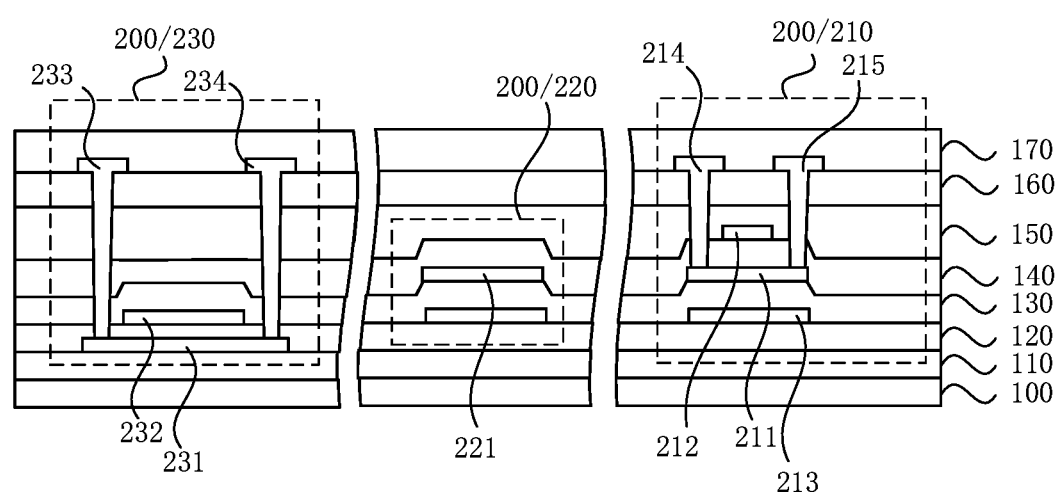
FIG. 2 is a section view taken along section line A-A' of FIG. 1.

FIG. 1 is a schematic diagram illustrating the structure of a display panel according to an embodiment of the present disclosure. FIG. 2 is a section view taken along section line A-A' of FIG. 1. Referring to FIGS. 1 and 2, this embodiment of the present disclosure provides a display panel 10. The display panel 10 includes a substrate 100 and a drive circuit 200 located on one side of the substrate 100. The drive circuit 200 includes a first transistor 210. The first transistor 210 includes a first active layer 211. The first active layer 211 includes an oxide semiconductor. The drive circuit 200 also includes a first capacitor 220. One capacitor plate 221 of the first capacitor 220 is disposed in the same layer as the first active layer 211.

The display panel 10 includes a substrate 100, multiple insulation layers and multiple metal layers, and the multiple insulation layers and metal layers are alternately arranged on one side of the substrate 100. The drive circuit 200 is included in the multiple insulation layers and the multiple metal layers. Illustratively, the multiple insulation layers on the one side of the substrate 100 may include a buffer layer 110, a first gate insulation layer 120, a first interlayer insulation layer 130, a second gate insulation layer 140, a second interlayer insulation layer 150, a third interlayer insulation layer 160, and a planarization layer 170. Based on the number and types of insulation layers, an adaptive adjustment may be made according to the practical display panel 10. Multiple transistors and capacitor structures may be included in the drive circuit 200. The number of transistors and capacitor structures is not limited in this embodiment of the present disclosure. In other words, the drive circuit 200 may be a pixel circuit or a shift register circuit. The type of the drive circuit 200 is not limited herein, and based on an adjustment on the type of the drive circuit 200, the numbers and the configuration positions of transistors and capacitor structures in the drive circuit 200 may be adaptively adjusted.

Further, as shown in FIG. 2, the drive circuit 200 includes the first transistor 210, the first transistor 210 includes the first active layer 211, and the first active layer 211 includes the oxide semiconductor. That is, the first transistor 210 is an oxide (indium gallium zinc oxide, IGZO) transistor, which has such advantages as low production cost and low power consumption. Additionally, the first transistor 210 may also include other structures such as a first gate 212, a second gate 213, a source 214 of the first transistor, and a drain 215 of the first transistor.

Further, the drive circuit 200 also includes a first capacitor 220. One capacitor plate 221 of the first capacitor 220 is disposed in the same layer as the first active layer 211. Disposing in the same layer herein may indicate that the first active layer 211 and one capacitor plate 221 of the first capacitor 220 are manufactured in the same patterning process using the same mask process. For example, a semiconductor layer is manufactured and patterned. The semiconductor layer structure retained in the configuration region of the first transistor 210 is the first active layer 211. The structure obtained after the semiconductor layer structure retained in the configuration region of the first capacitor 220 is conducted by ion doping is one capacitor plate 221 of the first capacitor 220. Although having different degrees of conductivity, the first active layer 211 and one capacitor plate 221 of the first capacitor 220 are both in contact with the first insulation layer 130 in a film structure, that is, the first active layer 211 and one capacitor plate 221 of the first capacitor 220 are located on the side of the first insulation layer 130 away from the substrate 100. Disposing in the same layer can reduce a manufacturing procedure of the first capacitor 220 in a manufacturing process of the display panel 10, and the manufacturing cost can be effectively saved. Moreover, reducing a film manufacturing procedure is conducive to achieving a thinning design of the display panel 10.

Alternatively, the drive circuit 200 may also include a second transistor 230, and the second transistor 230 may include a second active layer 231, a third gate 232, a source 233 of the second transistor, and a drain 234 of the second transistor. The second active layer 231 may include silicon, that is, the second transistor 230 is a low temperature poly silicon (LTPS) transistor, which has such advantages as high switch speed, high carrier mobility, and low power. Further, the drive circuit 200 provided by this embodiment of the present disclosure may combine the preceding two types of transistors, that is, the first transistor 210 and the second transistor 230. In other words, the LTPS is combined with the IGZO to obtain the display panel technology of LTPO (low-temperature polycrystalline oxide). The LTPO display panel not only has the advantages of the LTPS display panel, such as the high resolution, high reaction speed, high brightness, and high aperture ratio, but also has the advantages of the IGZO, such as the low production cost and low power consumption.

In summary, the drive circuit of the display panel provided by this embodiment of the present disclosure includes a first transistor. A first active layer of the first transistor includes an oxide semiconductor. One capacitor plate of a first capacitor in the drive circuit may be disposed in the same layer as the first active layer. In this manner, the process for manufacturing the display panel can be reduced, the manufacturing cost of the display panel can be saved, and a thinning design of the display panel as a whole can be better achieved.

Figure 3:
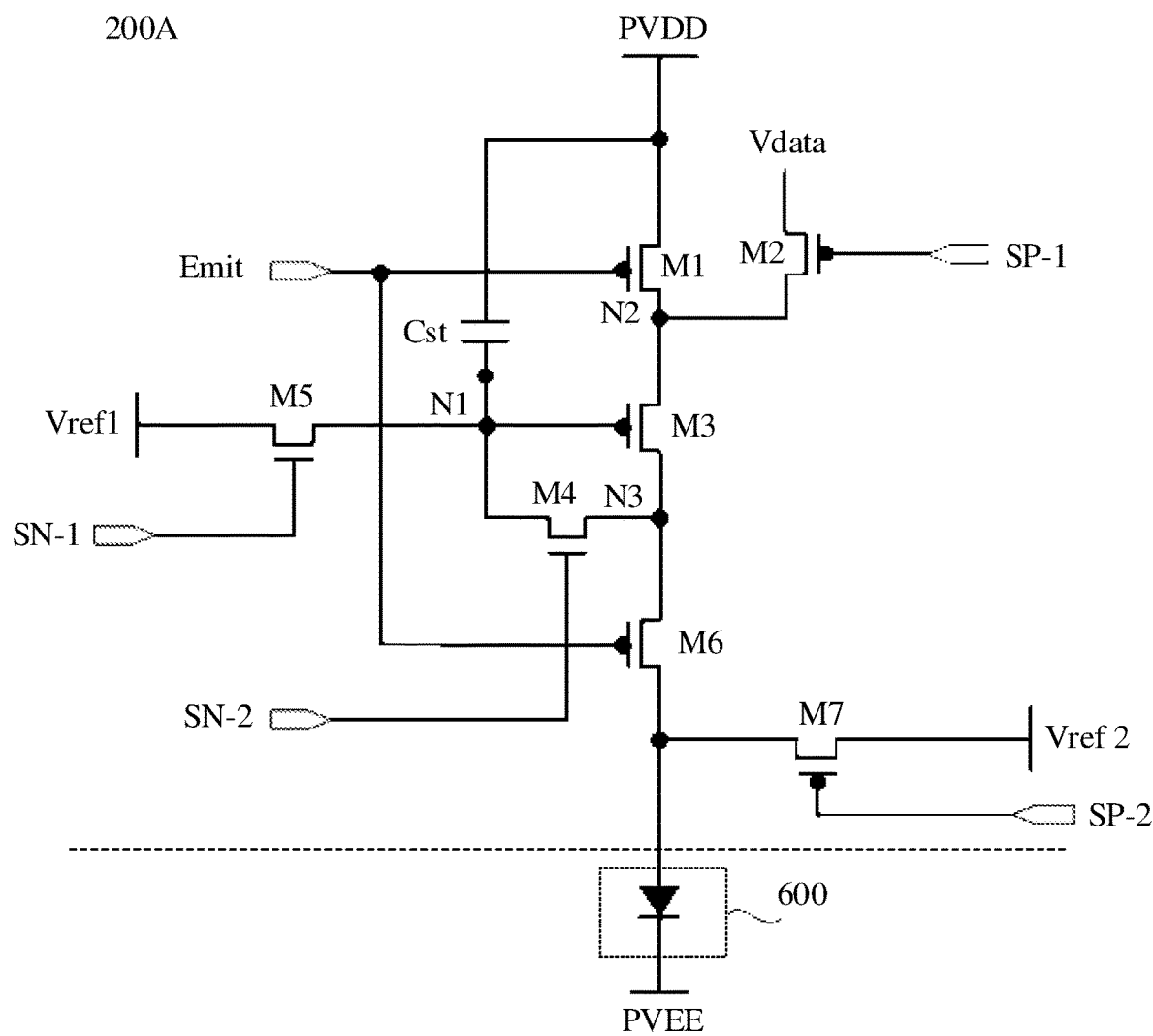
FIG. 3 is a schematic diagram of circuit elements in a pixel circuit according to an embodiment of the present disclosure.
Figure 4:
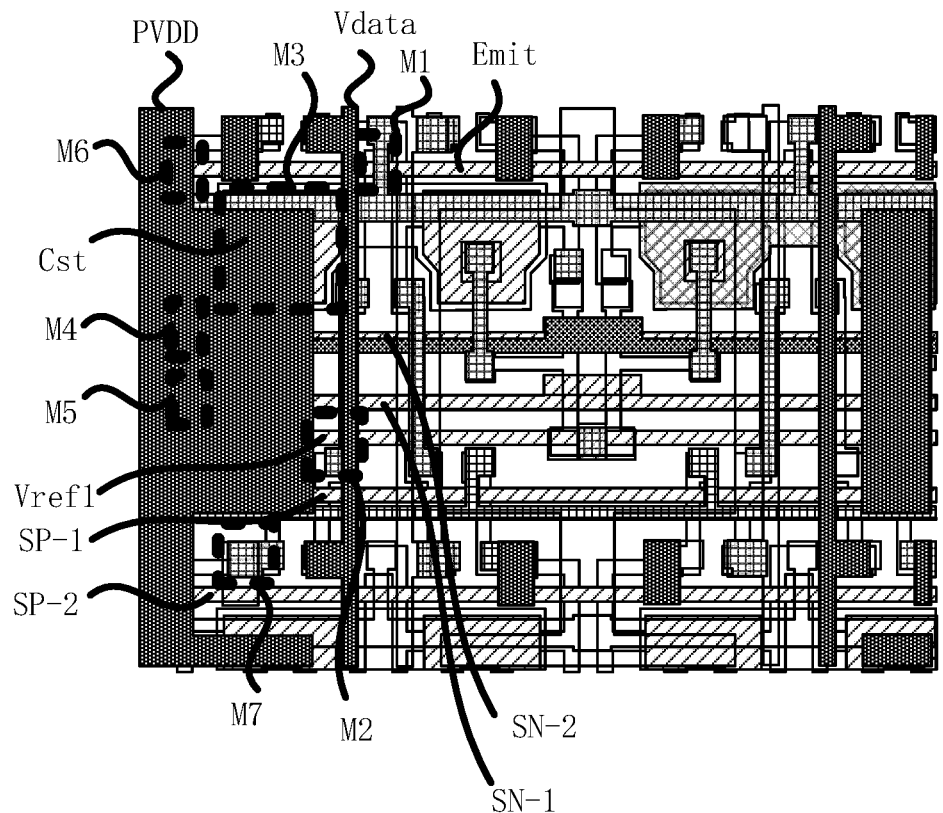
FIG. 4 is a schematic diagram illustrating the structure of another display panel according to an embodiment of the present disclosure.
Figure 5:
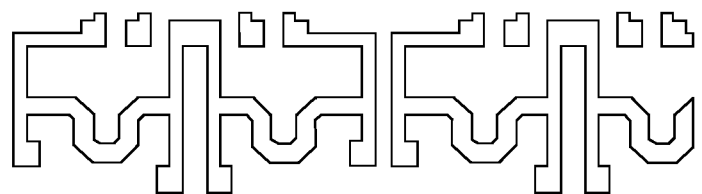
FIG. 5 is a schematic diagram of a part of the structure of the display panel of FIG. 4.
Figure 5:
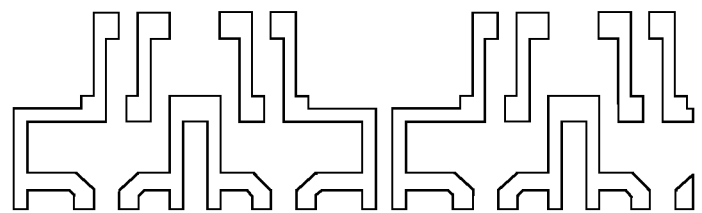
Figure 6:
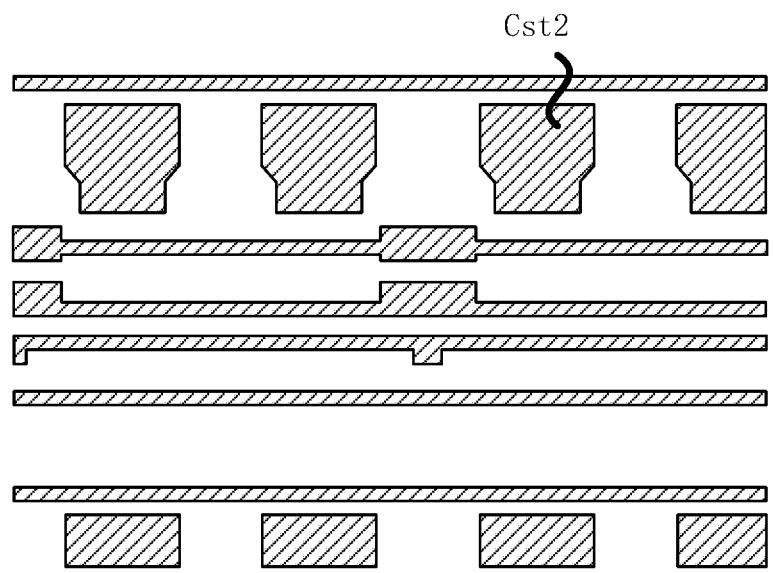
FIG. 6 is a schematic diagram of another part of the structure of the display panel of FIG. 4.
Figure 7:
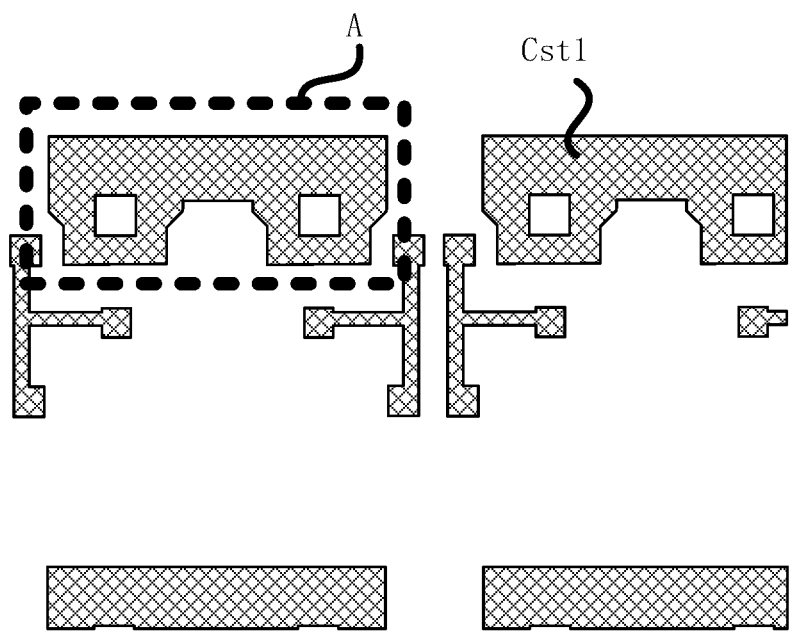
FIG. 7 is a schematic diagram of another part of the structure of the display panel of FIG. 4.
Figure 8:
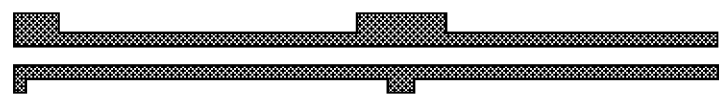
FIG. 8 is a schematic diagram of another part of the structure of the display panel of FIG. 4.
Figure 9:
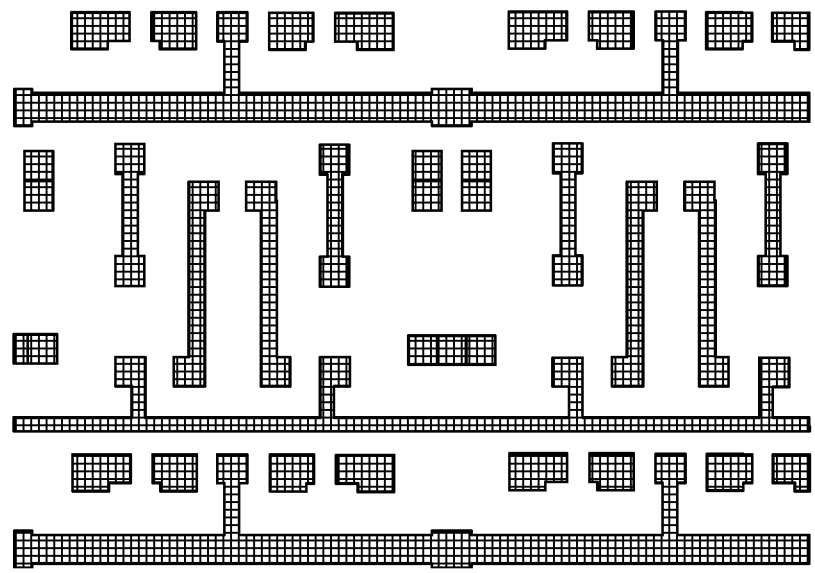
FIG. 9 is a schematic diagram of another part of the structure of the display panel of FIG. 4.
Figure 10:
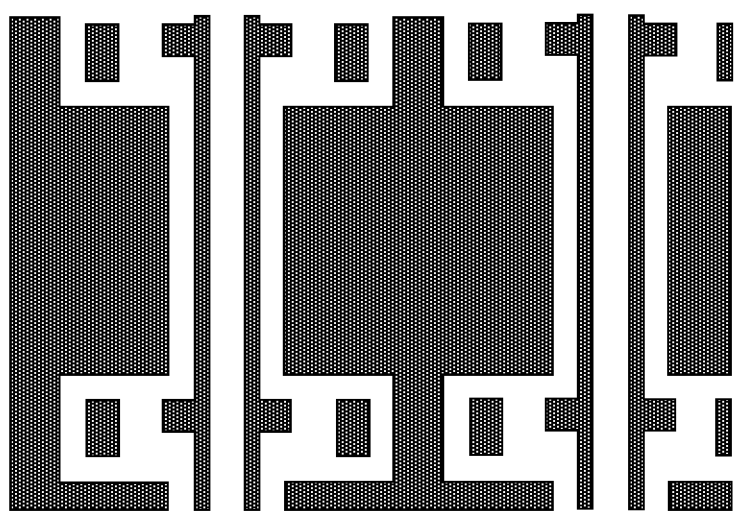
FIG. 10 is a schematic diagram of another part of the structure of the display panel of FIG. 4.

FIG. 3 is a schematic diagram of circuit elements in a pixel circuit according to an embodiment of the present disclosure. FIG. 4 is a schematic diagram illustrating the structure of another display panel according to an embodiment of the present disclosure. FIG. 5 is a schematic diagram of a part of the structure of the display panel of FIG. 4. FIG. 6 is a schematic diagram of another part of the structure of the display panel of FIG. 4. FIG. 7 is a schematic diagram of another part of the structure of the display panel of FIG. 4. FIG. 8 is a schematic diagram of another part of the structure of the display panel of FIG. 4. FIG. 9 is a schematic diagram of another part of the structure of the display panel of FIG. 4. FIG. 10 is a schematic diagram of another part of the structure of the display panel of FIG. 4. Referring to FIGS. 1 to 10, the drive circuit 200 includes a pixel circuit 200A, the pixel circuit 200A includes a storage capacitor Cst, and one capacitor plate Cst1 of the storage capacitor Cst is electrically connected to a power signal terminal PVDD. The first capacitor 220 includes the storage capacitor Cst.

The drive circuit 200 may include the pixel circuit 200A electrically connected to a light-emitting element 600 in the display panel 10. That is, the display panel 10 drives the light-emitting element 600 to display and emit light via the pixel circuit 200A to achieve a display function of the display panel 10.

The pixel circuit 200A includes the storage capacitor Cst electrically connected to the power supply signal terminal PVDD, as shown in FIG. 3. The storage capacitor Cst is the first capacitor 220, that is, a capacitor plate of the storage capacitor Cst is disposed in the same layer as the first active layer 211. In this manner, the manufacturing procedure of the display panel 10 is reduced, the manufacturing cost of the display panel 10 is saved, and the thinning design of the display panel 10 as a whole is better achieved.

Illustratively, referring to FIG. 3, a pixel circuit 200A including "7T1C" is used as an example in this embodiment of the present disclosure, where "T" denotes a transistor, and "C" denotes a capacitor. "C" is the storage capacitor Cst in this embodiment of the present disclosure, that is, "C" is the first capacitor 220. Alternatively, the description is made in conjunction with a structural schematic diagram and a structural circuit diagram of the pixel circuit 200A. The pixel circuit 200A includes a light-emitting control transistor M1, a data writing transistor M2, a drive transistor M3, a threshold compensation transistor M4, an initialization transistor M5, a second light-emitting control transistor M6, a reset transistor M7, and the storage capacitor Cst. A first scan signal line SN-1 controls the initialization transistor M5 of the drive circuit to be turned on and off. When the initialization transistor M5 is turned on, the gate potential of the drive transistor M3 is reset, that is, a first reset signal Vref1 is transmitted to the initialization transistor M5, and a connection node (a first node N1) of the drive transistor M3, the initialization transistor M5, the threshold compensation transistor M4, and the storage capacitor Cst is reset. A second scan signal line SP-1 controls the data writing transistor M2 of the drive circuit to be turned on and off. When the data writing transistor M2 is turned on, a data signal Vdata on the data signal line is written into the gate of the drive transistor M3. A third scan signal line SN-2 controls the threshold compensation transistor M4 to be turned on and off. When the threshold compensation transistor M4 is turned on, the threshold voltage of the drive transistor M3 is compensated. At the same time, a fourth scan signal line SP-2 controls the reset transistor M7 to be turned on and off. When the reset transistor M7 is turned on, the anode of the light-emitting element 600 connected to the pixel circuit 200 is reset, that is, a second reset signal Vref2 is transmitted to the anode of the light-emitting element 600. A light-emitting control signal Emit controls the light-emitting control transistor M1 and the second light-emitting control transistor M6 to be turned on and off. When the light-emitting control transistor M1 and the second light-emitting control transistor M6 are controlled to be turned on, a power signal PVDD is transmitted to the light-emitting element 600, thereby achieving display and light-emission of the light-emitting element 600. Illustratively, the light-emitting element 600 may be an organic light-emitting diode (OLED), a mini light-emitting diode (LED), a micro LED, or a quantum-dot light-emitting diode (QLED). The type of light-emitting element is not limited in this embodiment of the present disclosure. Further, the light-emitting element may include a red light-emitting element, a green light-emitting element, and a blue light-emitting element. Light-emitting elements of different colors may be arranged in many different manners, such as a diamond pixel arrangement, a standard red-green-blue (RGB) arrangement, a delta pixel arrangement, a pearl pixel arrangement, or a 2-in-1 pixel arrangement. The arrangement of light-emitting elements of different colors is not limited in this embodiment of the present disclosure.

Further, FIG. 4 is a schematic diagram illustrating the structure of the display panel 10 as a whole. The display panel 10 is arranged with overlapping layers of films so that it is convenient to clearly understand the configuration positions of the films. Referring to FIGS. 5 to 10, different films in the display panel 10 are illustrated one by one from the bottom to the top. That is, a film 310 where the second active layer 231 is disposed, a metal film 320 where the third gate 232 and the second gate 213 are disposed, a film 330 where the first active layer 211 is disposed, a metal film 340 where the first gate 212 is disposed, a metal film 360 where the source and drain are disposed, and a metal film 350 located between the metal film 340 and the metal film 360 for connecting the two are sequentially included. Referring to FIG. 7, region A shown in the figure is a capacitor plate Cst1 of the storage capacitor Cst, and the film where the capacitor plate Cst1 is disposed is the same film layer as the film 330 where the first active layer 211 is disposed. Illustratively, the film where the other capacitor plate Cst2 of the storage capacitor Cst is disposed may be the same layer as the metal film 320 where the third gate 232 and the second gate 213 are disposed, as shown in FIG. 6. The film position of the other capacitor plate Cst2 of the storage capacitor Cst is not limited in this embodiment of the present disclosure.

Figure 11:
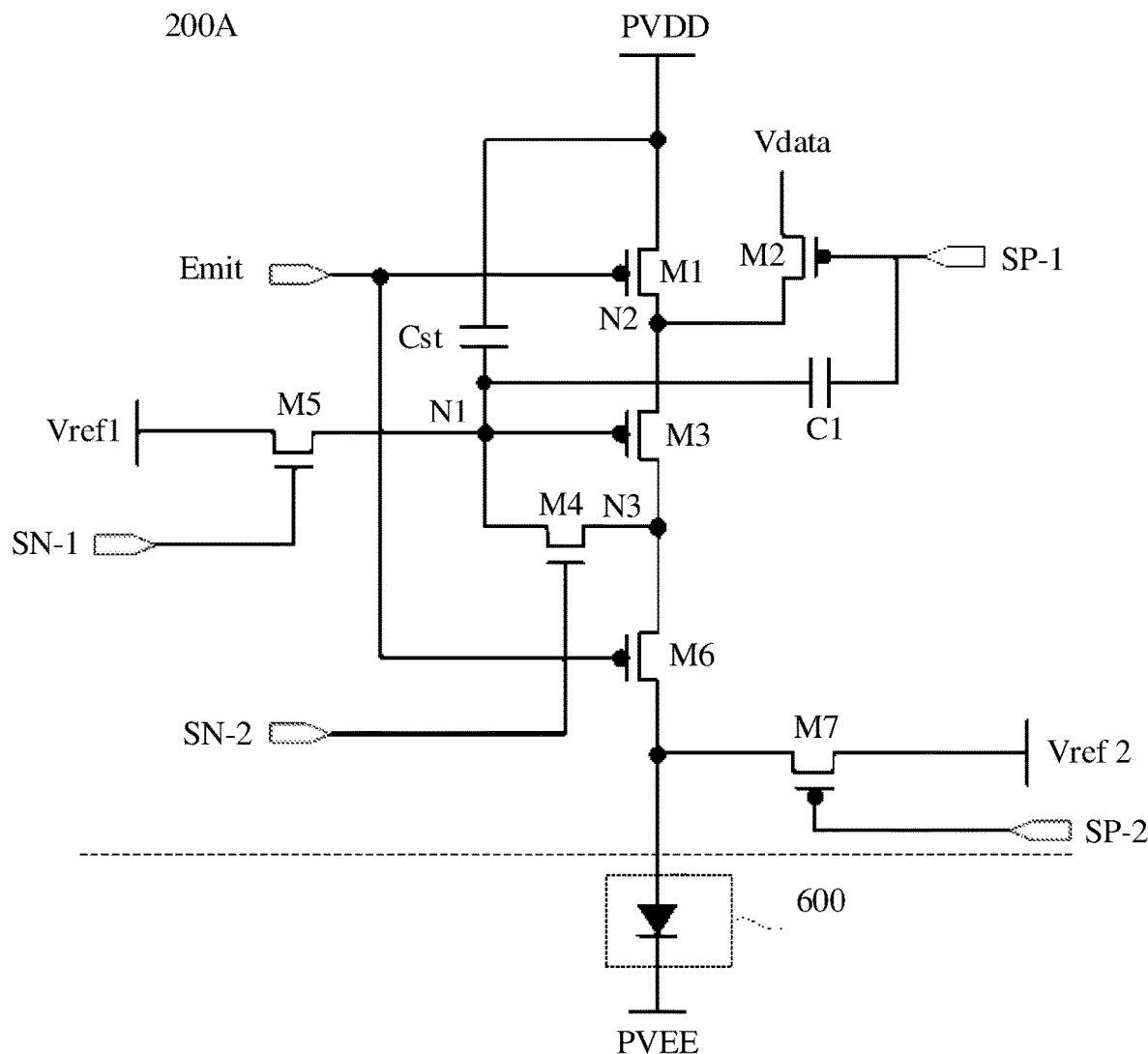
FIG. 11 is a schematic diagram of circuit elements in another pixel circuit according to an embodiment of the present disclosure.
Figure 12:
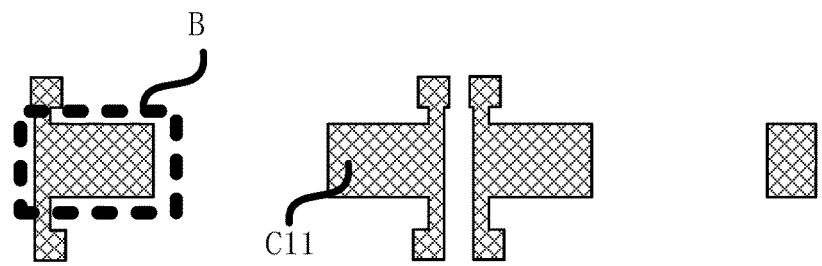
FIG. 12 is a schematic diagram of a part of the structure of a display panel according to an embodiment of the present disclosure.
Figure 13:
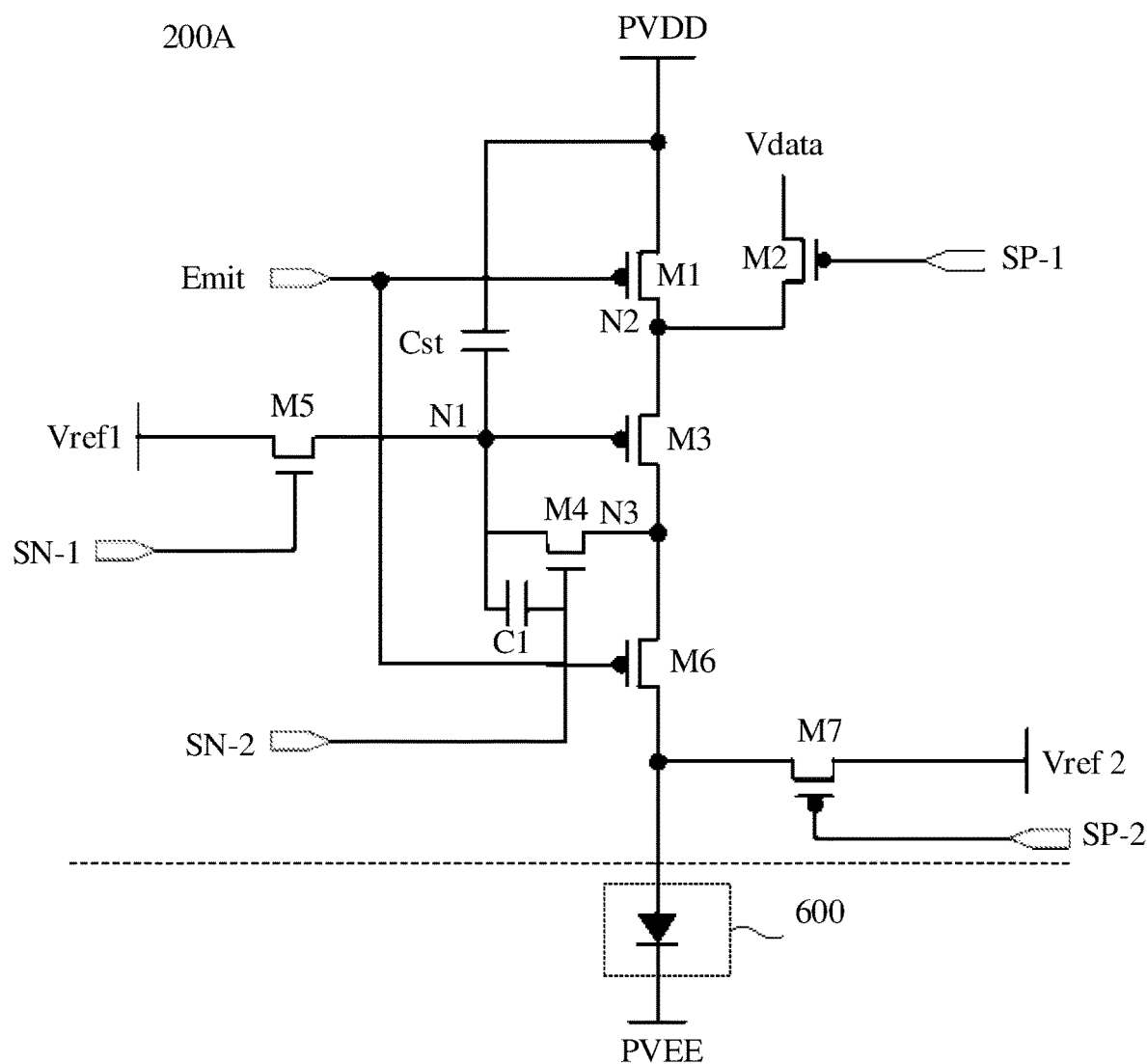
FIG. 13 is a schematic diagram of circuit elements in another pixel circuit according to an embodiment of the present disclosure.

FIG. 11 is a schematic diagram of circuit elements in another pixel circuit according to an embodiment of the present disclosure. FIG. 12 is a schematic diagram of a part of the structure of a display panel according to an embodiment of the present disclosure. FIG. 13 is a schematic diagram of circuit elements in another pixel circuit according to an embodiment of the present disclosure. Referring to FIGS. 11 to 13, a drive circuit 200 includes a pixel circuit 200A, the pixel circuit 200A includes a data writing transistor M2, a drive transistor M3, and a node potential adjustment capacitor C1 disposed in series between the gate of the data writing transistor M2 and the gate of the drive transistor M3. The first capacitor 220 includes the node potential adjustment capacitor C1.

In an embodiment, referring to FIG. 11, the node potential adjustment capacitor C1 included in the pixel circuit 200A is located between the data writing transistor M2 and the drive transistor M3. That is, one of the two capacitor plates of the node potential adjustment capacitor C1 is electrically connected to the gate of the data writing transistor M2, and the other capacitor plate of the node potential adjustment capacitor C1 is electrically connected to the gate of the drive transistor M3. Configuration of the node potential adjustment capacitor C1 may adjust the gate potential of the drive transistor M3 and ensure the operation stability of the entire pixel circuit 200A.

Further, the configuration position of the node potential adjustment capacitor C1 is flexible, which is not limited to being only between the gate of the data writing transistor M2 and the gate of the drive transistor M3. As shown in FIG. 13, the node potential adjustment capacitor C1 may also be disposed in series between the gate of the threshold compensation transistor M4 and the gate of the drive transistor M3.

In an embodiment, referring to FIG. 12, region B shown in the figure is a capacitor plate C11 of the node potential adjustment capacitor C1, and the film where the capacitor plate C11 is disposed is the same film layer as the film 330 where the first active layer 211 is disposed. The film position of the other capacitor plate of the node potential adjustment capacitor C1 is not limited in this embodiment of the present disclosure. Disposing in the same layer can reduce the manufacturing procedure of the display panel 10 and help achieve a thinning design of the display panel 10 as a whole.

Figure 14:
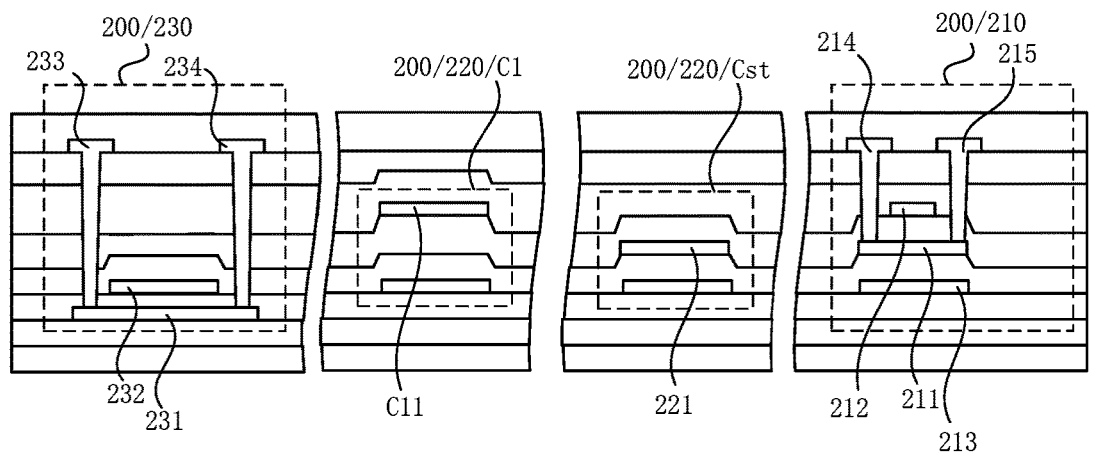
FIG. 14 is a schematic diagram illustrating the structure of another display panel according to an embodiment of the present disclosure.

FIG. 14 is a schematic diagram illustrating the structure of another display panel according to an embodiment of the present disclosure. Referring to FIGS. 11 and 14, the drive circuit 200 includes the pixel circuit 200A, and the pixel circuit 200A includes the data writing transistor M2, the drive transistor M3, the storage capacitor Cst, and the node potential adjustment capacitor C1. One capacitor plate of the storage capacitor Cst is electrically connected to the power signal terminal PVDD, the node potential adjustment capacitor C1 is disposed in series between the gate of the data writing transistor M2 and the gate of the drive transistor M3, the first capacitor 220 includes the storage capacitor Cst. the first transistor 210 also includes a first gate 212 located on the side of the first active layer 211 away from the substrate 100, and one capacitor plate C11 of the node potential adjustment capacitor C1 is disposed in the same layer as the first gate 212.

Illustratively, with continued reference to FIG. 11, a pixel circuit 200A including "7T2C" is used as an example in this embodiment of the present disclosure, where "T" denotes a transistor, and "C" denotes a capacitor. The two capacitors are the storage capacitor Cst and the node potential adjustment capacitor C1. The storage capacitor Cst is electrically connected to the power signal terminal PVDD. The node potential adjustment capacitor C1 is disposed in series between the gate of the data writing transistor M2 and the gate of the drive transistor M3. It should be noted that the configuration position of the node potential adjustment capacitor C1 is flexible, which is not limited to being only between the data writing transistor M2 and the drive transistor M3.

Further, referring to FIG. 14, the storage capacitor Cst is used as the first capacitor 220, and one capacitor plate 221 of the storage capacitor Cst is disposed in the same layer as the first active layer 211. One capacitor plate C11 of the node potential adjustment capacitor C1 is disposed in the same layer as the first gate 212 of the first transistor 210, that is, disposed in the same layer as the top gate of the first transistor 210. The two capacitor structures are disposed in the same layer as other structures, further reducing the manufacturing procedure of the display panel 10 and helping achieve the thinning design of the display panel 10 as a whole. Furthermore, one capacitor plate 221 of the storage capacitor Cst and the capacitor plate C11 of the node potential adjustment capacitor C1 are disposed in different layers so that it is also ensured that the capacitor plate 221 and the capacitor plate C11 each have sufficient configuration space. Since the storage capacitor Cst has higher requirements on the capacitance value. That is, under the premise of ensuring that both the storage capacitor Cst and the node potential adjustment capacitor C1 have sufficient configuration space, the capacitor plate 221 is disposed in the same layer as the first active layer 211 so that the distance between the two plates of the storage capacitor Cst is relatively small, and the capacitance value of the storage capacitor Cst is further ensured.

Figure 15:
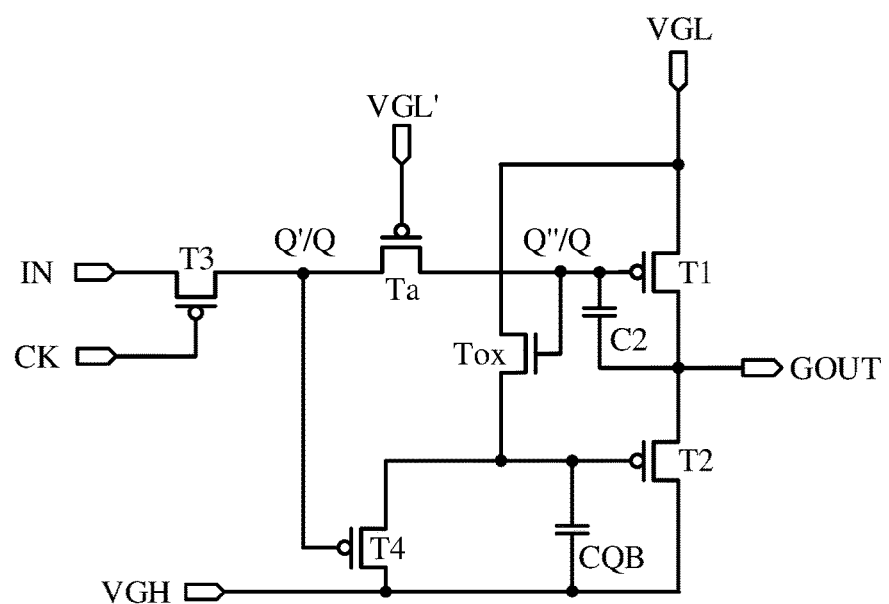
FIG. 15 is a schematic diagram of circuit elements in a shift register circuit according to an embodiment of the present disclosure.
Figure 16:
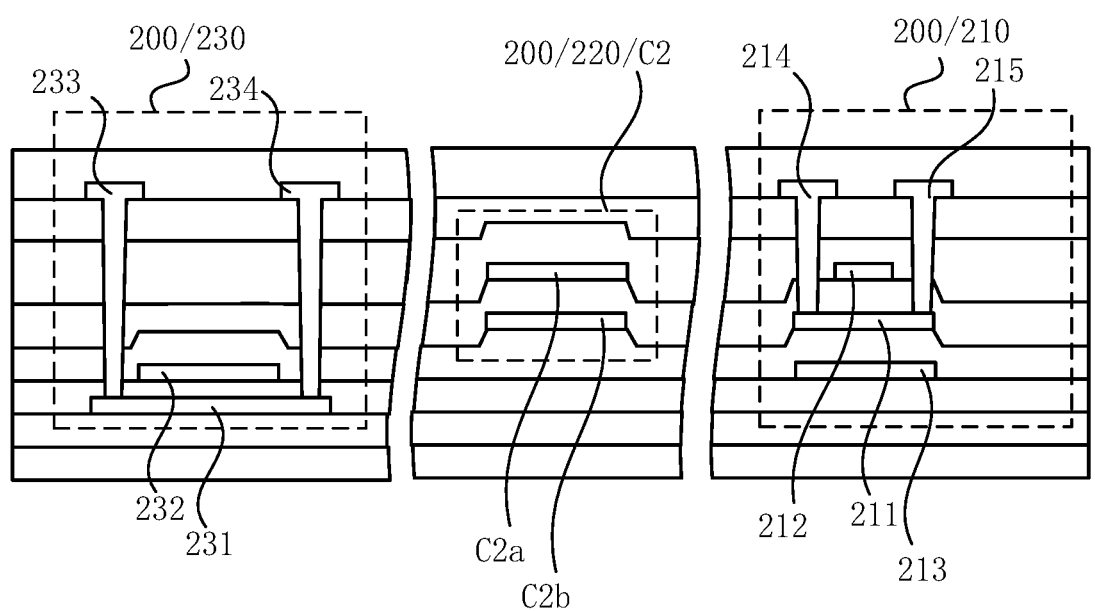
FIG. 16 is a schematic diagram illustrating the structure of another display panel according to an embodiment of the present disclosure.

FIG. 15 is a schematic diagram of circuit elements in a shift register circuit according to an embodiment of the present disclosure. FIG. 16 is a schematic diagram illustrating the structure of another display panel according to an embodiment of the present disclosure. Referring to FIGS. 15 and 16, the drive circuit 200 includes a shift register circuit 200B, and the shift register circuit 200B includes a bootstrap capacitor C2 and an output transistor T1. One terminal of the bootstrap capacitor C2 is electrically connected to the output terminal GOUT of the shift register circuit, and the other terminal of the bootstrap capacitor C2 is electrically connected to the gate of the output transistor T1. The first transistor 210 also includes a first gate 212 disposed on the side of the first active layer 211 away from the substrate 100. The first capacitor 220 includes the bootstrap capacitor C2, one capacitor plate C2b of the bootstrap capacitor C2 is disposed in the same layer as the first active layer 211, and the other capacitor plate C2a of the bootstrap capacitor C2 is disposed in the same layer as the first gate 212.

In an embodiment, the drive circuit 200 may include a shift register circuit 200B, and the shift register circuit 200B includes the output transistor T1 and the bootstrap capacitor C2, as shown in FIG. 15. Further, one terminal of the bootstrap capacitor C2 is electrically connected to the output terminal GOUT of the shift register circuit, and the other terminal of the bootstrap capacitor C2 is electrically connected to the gate of the output transistor T1, that is, the configuration position of the bootstrap capacitor C2 may be determined by the output terminal GOUT of the shift register circuit 200B and the output transistor T1. As shown in FIG. 15, the shift register circuit 200B also includes other transistors, capacitor structures, and the like, that is, the shift register circuit 200B also includes conventional configurations in the shift register circuit 200B, and details are not described herein. In the shift register circuit 200B, one plate of the bootstrap capacitor C2 is electrically connected to the gate of the output transistor T1 so that the potential of the gate of the output transistor T1 can be adjusted. The other terminal of the bootstrap capacitor C2 is electrically connected to the output terminal GOUT. Since the output transistor T1 is turned on by the low level, that is, the potential at one capacitor plate of the bootstrap capacitor C2 may become low according to an output low-level signal, and then the potential at the gate of the output transistor T1 is reduced via the bootstrap capacitor C2, thereby better ensuring the conduction degree of the output transistor T1.

In an embodiment, as shown in FIG. 16, the film where one capacitor plate C2b of the bootstrap capacitor C2 is disposed is the same as the film 330 where the first active layer 211 of the first transistor 210 is disposed. The other plate C2a of the bootstrap capacitor C2 may be disposed in the same layer as the first gate 212. Disposing in the same layer can reduce the manufacturing procedure of the display panel 10 and help achieve a thinning design of the display panel 10 as a whole. Further, the shift register circuit 200B does not have a first transistor 210, that is, the configuration space of the film where the first active layer 211 is disposed in the shift register circuit 200B is relatively large. In other words, the configuration space for the capacitor plate C2b of the bootstrap capacitor C2 on the same layer as the first active layer 211 is relatively large so that the storage performance of the bootstrap capacitor C2 and the stability of the capacitor can be ensured.

Figure 17:
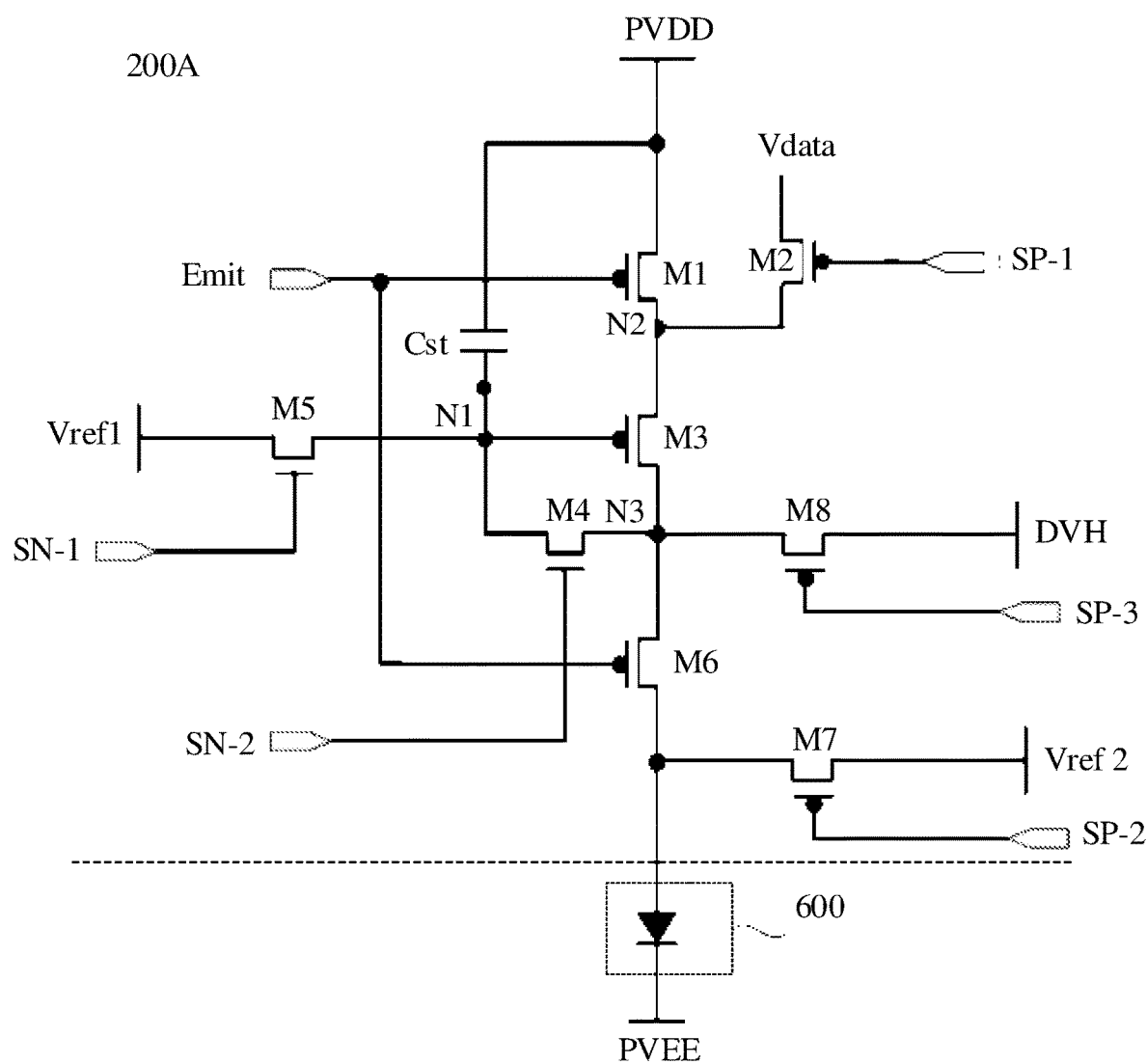
FIG. 17 is a schematic diagram of circuit elements in a pixel circuit according to an embodiment of the present disclosure.
Figure 18:
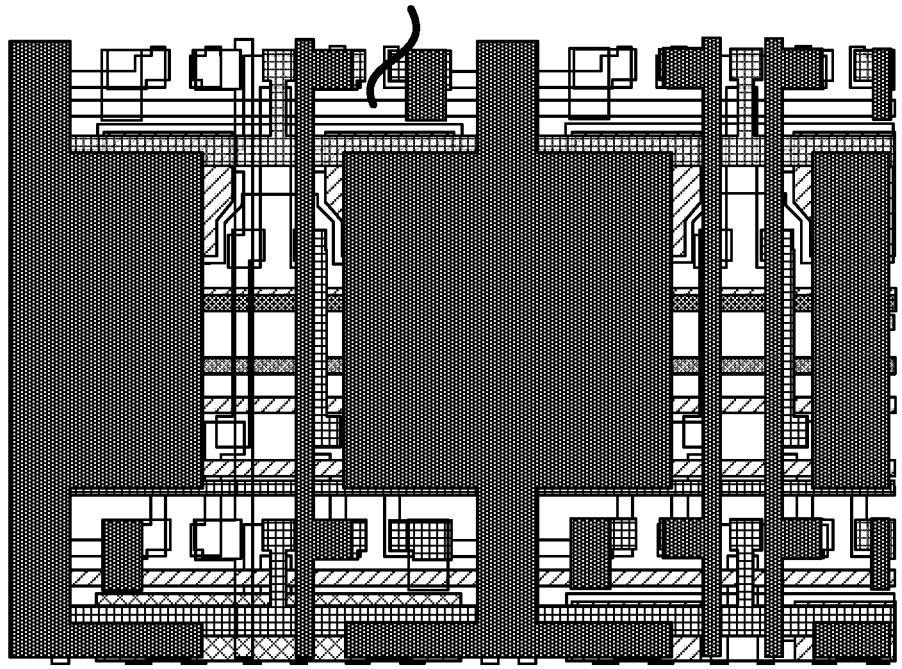
FIG. 18 is a schematic diagram illustrating the structure of another display panel according to an embodiment of the present disclosure.
Figure 19:
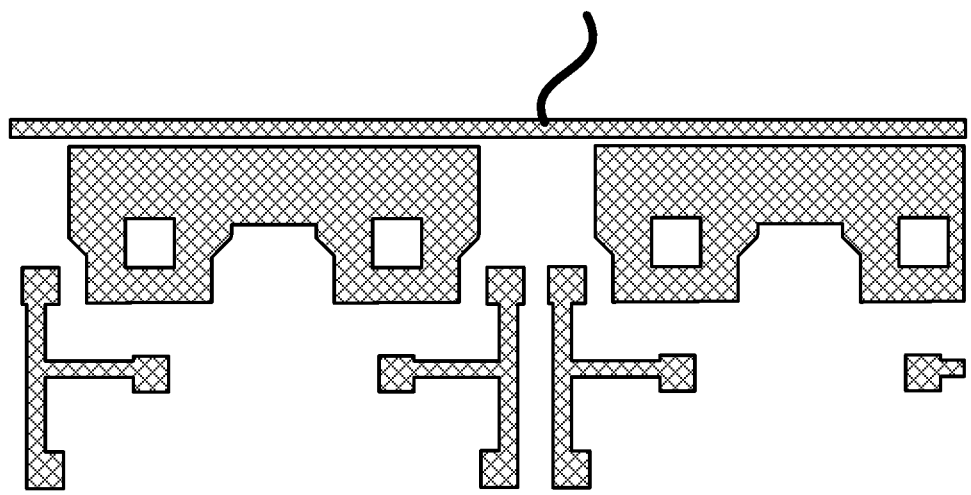
FIG. 19 is a schematic diagram of a part of the structure of the display panel of FIG. 18.
Figure 19:
Figure 19:
Figure 20:
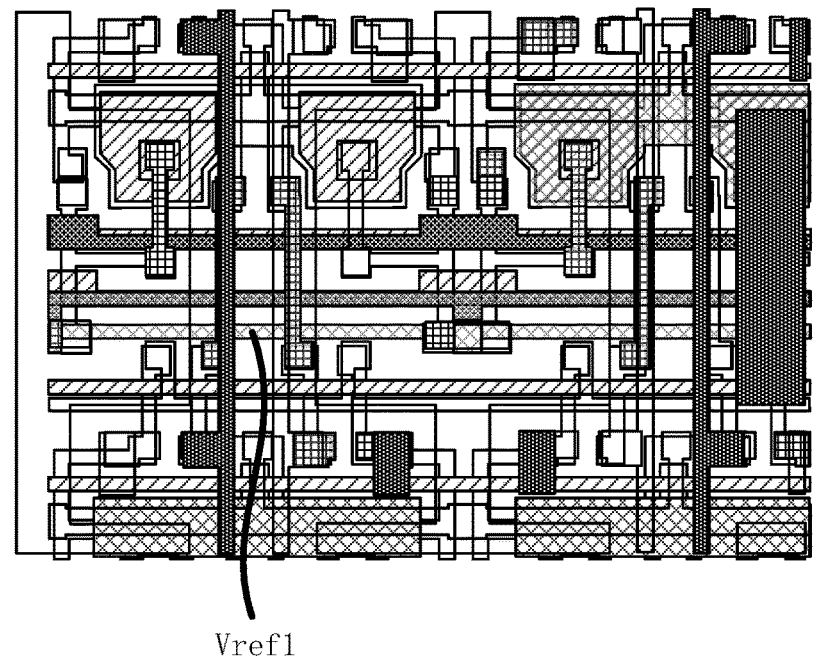
FIG. 20 is a schematic diagram illustrating the structure of another display panel according to an embodiment of the present disclosure.
Figure 21:
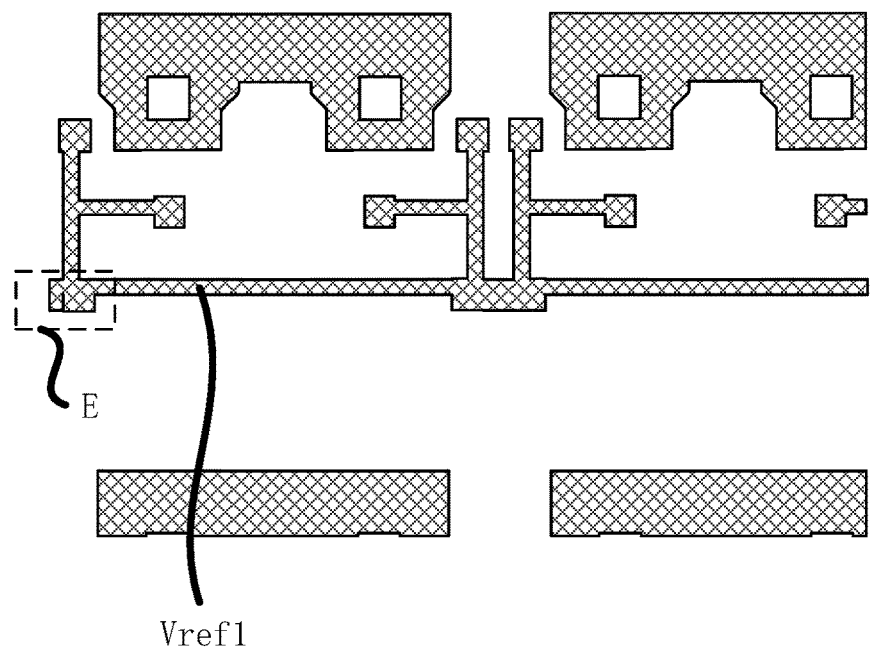
FIG. 21 is a schematic diagram of a part of the structure of the display panel of FIG. 20.

FIG. 17 is a schematic diagram of circuit elements in a pixel circuit according to an embodiment of the present disclosure. FIG. 18 is a schematic diagram illustrating the structure of another display panel according to an embodiment of the present disclosure. FIG. 19 is a schematic diagram of a part of the structure of the display panel of FIG. 18. FIG. 20 is a schematic diagram illustrating the structure of another display panel according to an embodiment of the present disclosure. FIG. 21 is a schematic diagram of a part of the structure of the display panel of FIG. 20. Referring to FIG. 3 and FIGS. 17 to 21, the drive circuit 200 includes a pixel circuit 200A, and the pixel circuit includes a light-emitting control transistor M1, an initialization transistor M5, and a bias adjustment transistor M8, and the display panel 10 also includes a light-emitting control signal line Emit, an initialization signal line Vref1, and a bias adjustment signal line DVH. The light-emitting control signal line Emit is electrically connected to the gate of the light-emitting control transistor M1, the initialization signal line Vref1 is electrically connected to the input terminal of the initialization transistor M5, and the bias adjustment signal line DVH is electrically connected to the input terminal of the bias adjustment transistor M8. At least one of the light-emitting control signal line Emit, the initialization signal line Vref1, or the bias adjustment signal line DVH is disposed in the same layer as the first active layer 211.

In an embodiment, referring to FIG. 17, the pixel circuit 200A includes the light-emitting control transistor M1, the initialization transistor M5, and the bias adjustment transistor M8. The control terminal of the light-emitting control transistor M1 is electrically connected to the light-emitting control signal line Emit, that is, the gate of the light-emitting control transistor M1 is electrically connected to the light-emitting control signal line Emit, the input terminal of the initialization transistor M5 is electrically connected to the initialization signal line Vref1, and the input terminal of the bias adjustment transistor M8 is electrically connected to the bias adjustment signal line DVH, thereby achieving light-emitting control, initialization adjustment, bias adjustment, and the like of the pixel circuit 200A.

Further, the film corresponding to the first active layer 211 where the light-emitting control signal line Emit, the initialization signal line Vref1, and the bias adjustment signal line DVH are disposed may be arranged in a conductive manner so that the corresponding film may have the metal characteristic for performing signal transmission.

In an embodiment, as shown in FIG. 18 and FIG. 19, the light-emitting control signal line Emit is disposed in the same layer as the first active layer 211, that is, the light-emitting control signal line Emit reuses the corresponding region where the first active layer 211 is disposed in the film 330. Referring to the light-emitting control signal line Emit in FIG. 19, when the light-emitting control signal line Emit is manufactured in the display panel 10, one manufacturing procedure can be reduced, and the manufacturing cost of the display panel 10 can be saved. As shown in FIG. 20 and FIG. 21, the initialization signal line Vref1 is disposed in the same layer as the first active layer 211, that is, the initialization signal line Vref1 reuses the corresponding region of the film 330 where the first active layer 211 is disposed. Referring to the initialization signal line Vref1 in FIG. 21, when the initialization signal line Vref1 is manufactured in the display panel 10, one manufacturing procedure can be reduced, and the manufacturing cost of the display panel 10 can be saved. Meanwhile, referring to region E in FIG. 21, the initializing signal line Vref1 and the film 330 originally in this region need to be electrically connected across layers. The initializing signal line Vref1 is disposed at the film 330 so that a perforation process can be reduced, and the manufacturing procedure of the display panel 10 can also be reduced.

Similarly, the bias adjustment signal line DVH is disposed in the same layer as the first active layer 211 so that a manufacturing procedure can also be reduced, and the manufacturing cost of the display panel 10 can be saved. Further, the light-emitting control signal line Emit, the initialization signal line Vref1, and the bias adjustment signal line DVH may be all disposed in the same layer as the first active layer 211 to more effectively control the manufacturing cost of the display panel 10.

Figure 22:
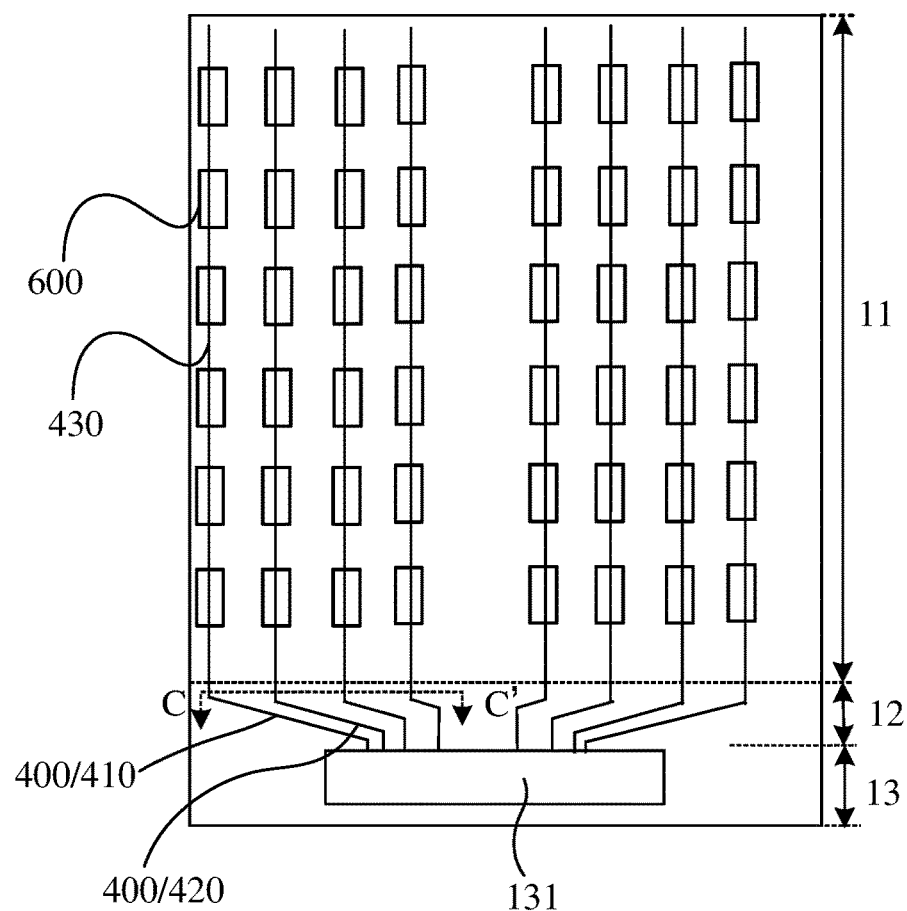
FIG. 22 is a schematic diagram illustrating the structure of another display panel according to an embodiment of the present disclosure.
Figure 23:
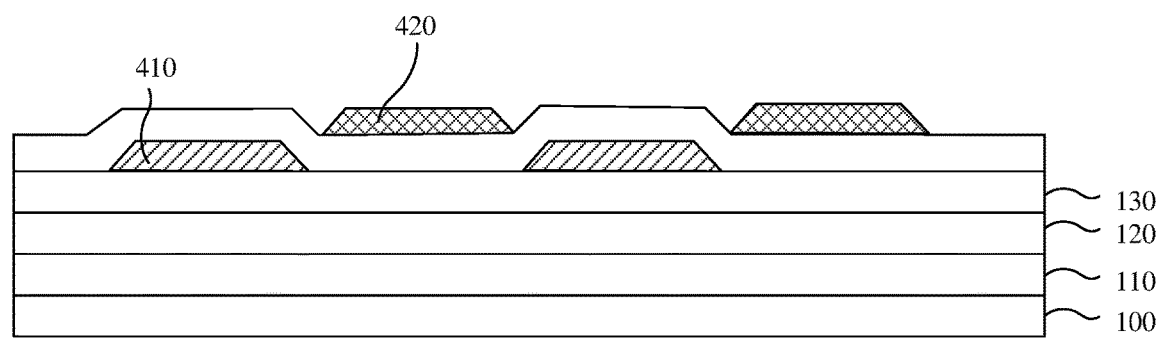
FIG. 23 is a section view taken along section line C-C' of FIG. 22.

FIG. 22 is a schematic diagram illustrating the structure of another display panel according to an embodiment of the present disclosure. FIG. 23 is a section view taken along section line C-C' of FIG. 22. Referring to FIGS. 2, 22, and 23, the display panel 10 also includes a fan-out wire region 12 and fan-out wires 400 disposed in the fan-out wire region 12. The fan-out wires 400 include at least one layer of wire structures, and at least a portion of the fan-out wires 400 are disposed in the same layer as the first active layer 211.

In an embodiment, the display panel 100 includes a display region 11 and a fan-out wire region 12. The display region 11 is provided with a light-emitting element 600 and a data line 430 connected to the light-emitting element 600. The data line 430 is configured to provide a data signal for the light-emitting element 600 so that the light-emitting element 600 emits light and displays according to the data signal.

Additionally, the display panel 10 also includes a non-display region located on at least one side of the display region 11. For example, FIG. 22 is used as an example where the non-display region is located on the lower side of the display region 11. The non-display region may include a fan-out wire region 12 and a binding region 13. The fan-out wire region 12 is provided with fan-out wires 400. The binding region 13 is provided with a drive chip 131. The fan-out wire region 410 is electrically connected to the data line 430 and the drive chip 131 separately for transmitting a data signal output from the drive chip to the data line 430.

In this embodiment of the present disclosure, adjacent fan-out wires 400 may be disposed in different layers. That is, referring to FIG. 23, a fan-out wire 410 and a fan-out wire 420 are disposed in different layers so that parasitic capacitance between adjacent signal wires can be avoided, influence and interference of signal transmission can be avoided, and display effect of the display panel 10 can be ensured. Thus, the area of the lower bezel occupied by the fan-out wires can be reduced, the area of the lower bezel is reduced, and the screen ratio of the display panel is increased.

Comparing and referring to FIG. 2 and FIG. 23, a portion of the fan-out wires 410 are disposed in the same layer as the first active layer 211 so that the manufacturing procedure of the fan-out wires 410 can be reduced, thus reducing the cost of the overall manufacturing of the display panel 10. Moreover, the fan-out wires 410 do not need to occupy one more film, thus facilitating a thinning design of the display panel 10 as a whole.

Figure 24:
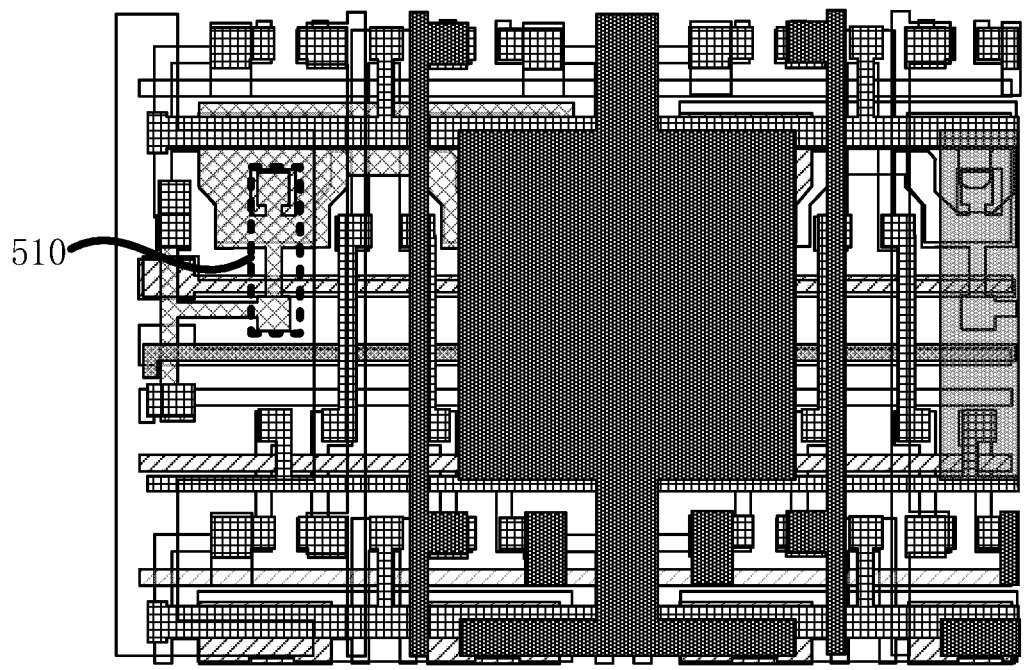
FIG. 24 is a schematic diagram illustrating the structure of another display panel according to an embodiment of the present disclosure.
Figure 25:
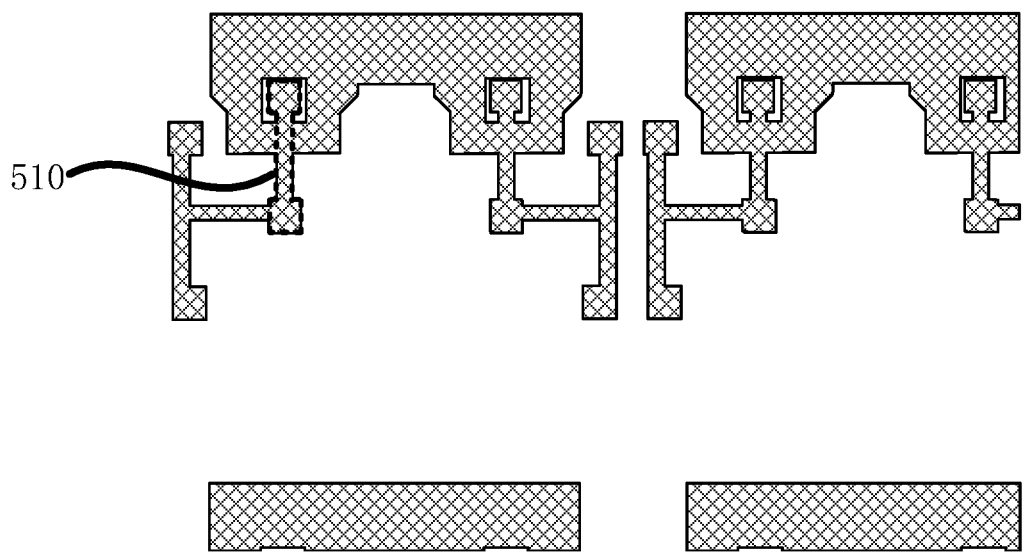
FIG. 25 is a schematic diagram of a part of the structure of the display panel of FIG. 24.

FIG. 24 is a schematic diagram illustrating the structure of another display panel according to an embodiment of the present disclosure. FIG. 25 is a schematic diagram of a part of the structure of the display panel of FIG. 24. Referring to FIGS. 3, 24, and 25, the drive circuit 200 includes a pixel circuit 200A, the pixel circuit 200A includes a drive transistor M3 and a threshold compensation transistor M4, and the output terminal of the threshold compensation transistor M4 is electrically connected to the gate of the drive transistor M3 via a first connection structure 510. The first connection structure 510 is disposed in the same layer as the first active layer 211.

In an embodiment, as shown in FIG. 3, the drive transistor M3 and the threshold compensation transistor M4 in the pixel circuit 200A are connected to each other, that is, the output terminal of the threshold compensation transistor M4 is electrically connected to the gate of the drive transistor M3. As shown in FIG. 24, the drive transistor M3 and the threshold compensation transistor M4 are electrically connected by configuration of the first connection structure 510.

Further, as shown in FIG. 25, the first connection structure 510 for connecting the drive transistor M3 and the threshold compensation transistor M4 is disposed in the same layer as the first active layer 211, that is, the first connection structure 510 and the first active layer 211 are both disposed in the film 330. The first connection structure 510 is disposed on the existing film 330 so that an individual manufacturing procedure of the first connection structure 510 can be reduced, and the manufacturing cost of the display panel 10 is saved. Moreover, the manner of sharing a film is also beneficial to achieve a thinning design of the display panel 10. Further, the first connection structure 510 is disposed at the film 330 so that the process of perforating the first connection structure 510 across layers to electrically connect to the film 330 can be avoided, that is, the perforation process and the manufacturing procedure of the display panel 10 can be reduced.

Figure 26:
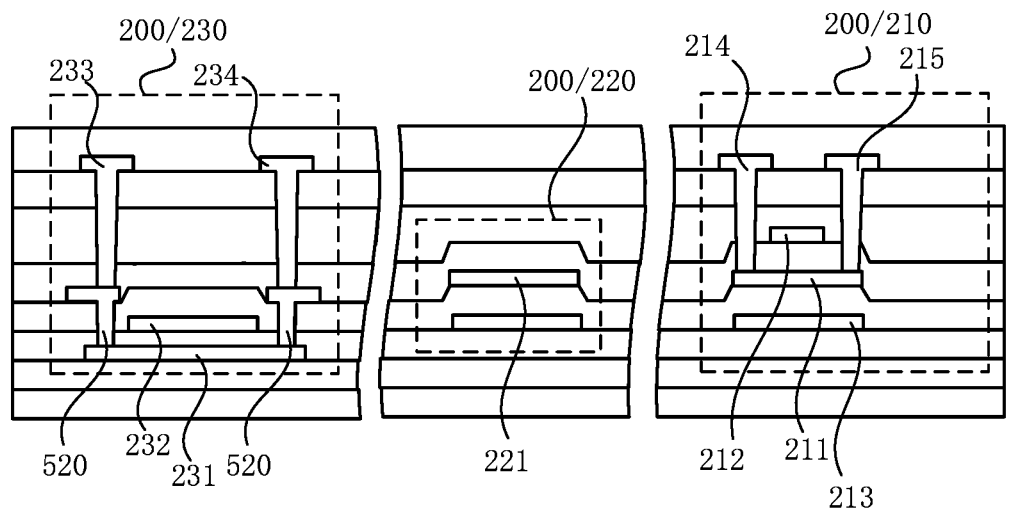
FIG. 26 is a schematic diagram illustrating the structure of another display panel according to an embodiment of the present disclosure.

FIG. 26 is a schematic diagram illustrating the structure of another display panel according to an embodiment of the present disclosure. Referring to FIG. 26, the drive circuit 200 also includes second transistors 230, the second transistor 230 includes a second active layer 231, and the second active layer 231 includes silicon. The display panel 10 also includes a second connection structure 520, the sources 233 and the drains 234 of at least a portion of the second transistors 230 are electrically connected to the second active layer 231 via the second connection structure 520; and the second connection structure 520 is disposed in the same layer as the first active layer 211.

The drive circuit 200 of the display panel 10 also includes a second transistor 230, and the second active layer 231 of the second transistor 230 includes silicon, that is, the second transistor 230 is an LTPS transistor, which has the advantages of high switch speed, high carrier mobility, and low power.

Further, the display panel 10 also includes a second connection structure 520. In the second transistor 230, the source 233 and the drain 234 are electrically connected to the second active layer 231 via the second connection structure 520, that is, signal transmission of the second transistor 230 is achieved. The second connection structure 520 is configured so that the perforation depth of the source 233 and the drain 234 can be reduced, thereby reducing the difficulty in manufacturing the display panel 10 and ensuring the stability of signal transmission in the second transistor 230. In this manner, the overall lap signal is better.

Further, in the second transistor 230, the second connection structure 520 for connecting the source 233 and the second active layer 231 may be disposed in the same layer as the first active layer 211. By disposing in the same layer, the second connection structure 520 and the first active layer 211 may be manufactured in the same procedure, and the entire manufacturing cost of the display panel 10 is reduced. Moreover, a film used by the second connection structure 520 does not need to be provided, that is, the film structure separately provided for the second connection structure 520 can be reduced, thus facilitating a thinning design of the display panel 10 as a whole.

Figure 27:
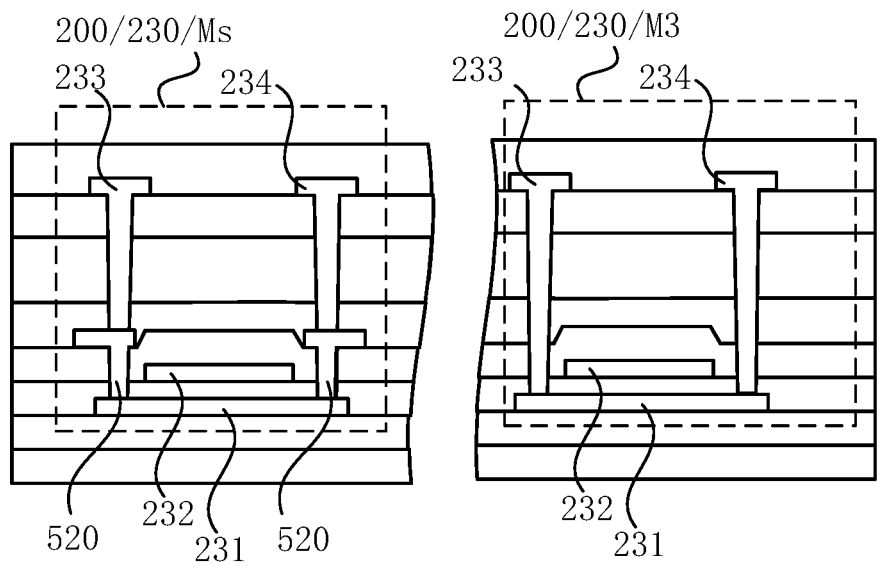
FIG. 27 is a schematic diagram illustrating the structure of another display panel according to an embodiment of the present disclosure.

FIG. 27 is a schematic diagram illustrating the structure of another display panel according to an embodiment of the present disclosure. Referring to FIGS. 3 and 27, the drive circuit 200 includes a pixel circuit 200A, and the second transistor 230 includes a switch transistor Ms and a drive transistor M3. At least the source 233 and the drain 234 of the switch transistor Ms are electrically connected to the second active layer 231 via the second connection structure 520.

In an embodiment, the pixel circuit 200A includes a drive transistor M3 and a switch transistor Ms. The switch transistor Ms may refer to the light-emitting control transistor M1, the data writing transistor M2, the threshold compensation transistor M4, the initialization transistor M5, the second light-emitting control transistor M6, the reset transistor M7, and so on, which is not limited in this embodiment of the present disclosure.

Further, as shown in FIG. 27, the switch transistor Ms and the drive transistor M3 may both be the second transistor 230. Further, in a portion of switch transistors Ms, the source 233 and the drain 234 may be electrically connected to the second active layer 231 via the second connection structure 520. In this manner, it is ensured that the electrical connection of the source 233 and the drain 234 of the switch transistor Ms to the second active layer 231 can be more stable, the operation is more stable, and the current is better prevented from leaking.

With continued reference to FIGS. 15 and 27, the drive circuit 200 includes a shift register circuit 200C, and the source 233 and the drain 234 of the second transistor 230 in the shift register circuit 200C are electrically connected to the second active layer 231 via the second connection structure 520.

Further, a second transistor 230 is also included in the shift register circuit 200C, that is, an LTPS transistor is included. As for the second transistor 230 in the shift register circuit 200C, the current may be prevented from leaking via the second connection structure. In this manner, it is ensured that the operation of the second transistor 230 in the shift register circuit 200C is more stable, the current is better prevented from leaking, and the transistor is better controlled.

Figure 28:
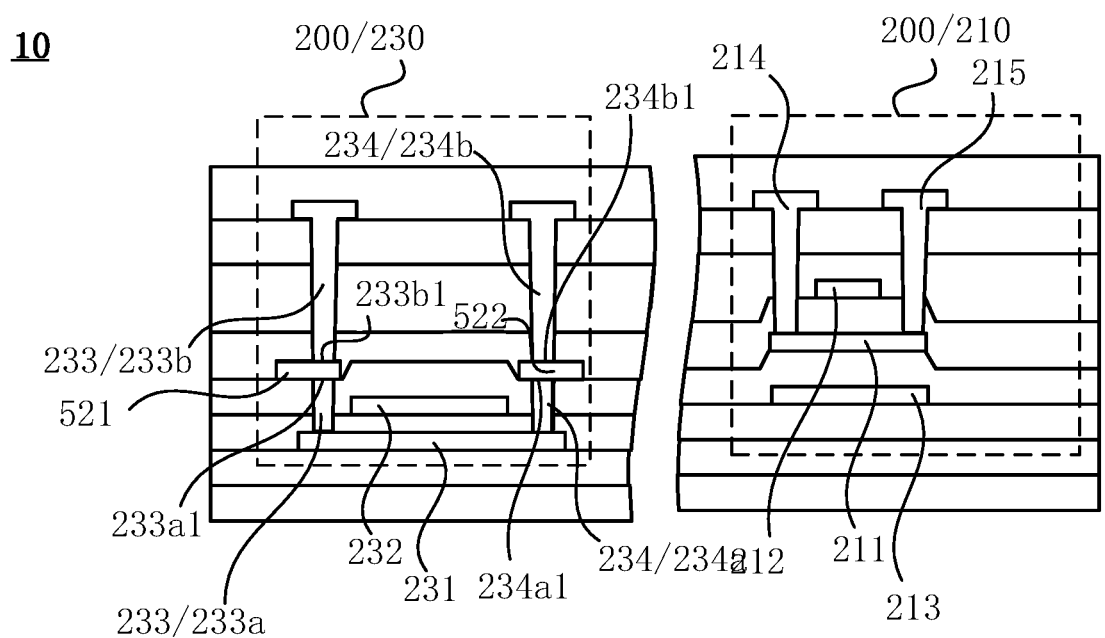
FIG. 28 is a schematic diagram illustrating the structure of another display panel according to an embodiment of the present disclosure.

FIG. 28 is a schematic diagram illustrating the structure of another display panel according to an embodiment of the present disclosure. Referring to FIGS. 2 and 28, the drive circuit 200 also includes a second transistor 230, and the second transistor 230 includes a second active layer 231, a source 233, and a drain 234. The second active layer 231 includes silicon, and both the source 233 and the drain 234 are electrically connected to the second active layer 231. The source 233 includes a first source portion 233a and a second source portion 233b, and the first source portion 233a is located on the side of the second source portion 233b adjacent to the second active layer 231. The first source portion 233a includes a first source surface 233a1 adjacent to the side of the second source portion 233b, and the second source portion 233b includes a second source surface 233b1 adjacent to the side of the first source portion 233a, The drain 234 includes a first drain portion 234a and a second drain portion 234b, and the first drain portion 234a is disposed on the side of the second drain portion 234b adjacent to the second active layer 231, the first drain portion 234a includes a first drain surface 234a1 adjacent to the side of the second drain portion 234b, and the second drain portion 234b includes a second drain surface 234b1 adjacent to the side of the first drain portion 234a. The display panel also includes a source connection portion 521 and/or a drain connection portion 522. The source connection portion 521 is located between a film in which the first source portion 233a is disposed and a film in which the second source portion 233b is disposed and is electrically connected to the first source portion 233a and the second source portion 233b separately, and the area of the source connection portion 521 is larger than both the area of the first source surface 233a1 and the area of the second source surface 233b1. The drain connection portion 522 is located between a film in which the first drain portion 234a is disposed and a film in which the second drain portion 234b is disposed and is electrically connected to the first drain portion 234a and the second drain portion 234b separately, and the area of the drain connection portion 522 is larger than both the area of the first drain surface 234a1 and the area of the second drain surface 234b1.

In an embodiment, as shown in FIGS. 2 and 28, both the source 233 and the drain 234 of the second transistor 230 are electrically connected to the second active layer 231 to ensure the normal operation of the second transistor 230. As shown in FIG. 2, the source 233 and the drain 234 need to be electrically connected to the second active layer 231 by penetrating the multiple insulation layers, that is, deep perforation needs to be performed in manufacturing the source 233 and the drain 234 to ensure the electrical connection to the second active layer 231. In the manufacturing process of the display panel 10, when it is ensured that the overall structure of the display panel 10 is stable, the process difficulty in accurately etching the source 233 and the drain 234 is relatively large. Further, as shown in FIG. 28, the source 233 includes the first source portion 233a and the second source portion 233b, and the drain 234 includes the first drain portion 234a and the second drain portion 234b. That is, the source 233 and the drain 234, which were manufactured by one deep perforation process, are manufactured by two or more perforations in a stepwise manner. In this manner, adverse effects of the deep perforation on the display panel 10 can be reduced.

The first source portion 233a is adjacent to the second active layer 231, and the second source portion 233b is away from the second active layer 231 compared with the first source portion 233a. The first source surface 233a1 of the first source portion 233a is adjacent to one side of the second source portion 233b, and the second source surface 233b1 of the second source portion 233b is adjacent to one side of the first source portion 233a. Similarly, the first drain portion 234a is adjacent to the second active layer 231, and the second drain portion 234b is away from the second active layer 231 compared with the first drain portion 234a. Further, the first drain surface 234a1 of the first drain portion 234a is adjacent to one side of the second drain portion 234b, and the second drain surface 234b1 of the second drain portion 234b is adjacent to one side of the first source portion 234a. Further, the source connection portion 521 is disposed between the first source surface 233a1 and the second source surface 233b1 so that the electrical connection between the first source portion 233a and the second source portion 233b is achieved, and the electrical connection between the source 233 and the second active layer 231 is ensured. The drain connection portion 522 is disposed between the first drain surface 234a1 and the second drain surface 234b1 so that the electrical connection between the first drain portion 234a and the second drain portion 234b is achieved, and the electrical connection between the drain 234 and the second active layer 231 is ensured. It should be noted that the source connection portion 521 and the drain connection portion 522 may be disposed at the same time in the display panel 10, or only one of the source connection portion 521 or the drain connection portion 522 is provided according to process requirements, which is not limited in this embodiments of the present disclosure.

Further, the area of the source connection portion 521 is larger than both the area of the first source surface 233a1 and the area of the second source surface 233b1. That is, when the electrical connection between the first source portion 233a and the second source portion 233b is ensured, configuring the source connection portion 521 with a larger area can reduce the alignment accuracy requirement for the first source portion 233a and the second source portion 233b and thus reduce the difficulty in manufacturing the display panel 10. Similarly, the area of the drain connection portion 522 is larger than both the area of the first drain surface 234a1 and the area of the second drain surface 234b1. That is, when the electrical connection between the first drain portion 234a and the second drain portion 234b is ensured, configuring the drain connection portion 522 with a larger area can reduce the alignment accuracy requirement for the first drain portion 234a and the second drain portion 234b and thus reduce the difficulty in manufacturing the display panel 10.

With continued reference to FIG. 28, both the source connection portion 521 and the drain connection portion 522 are disposed in the same layer as the first active layer 211.

Further, the source connection portion 521 and the drain connection portion 522 are disposed in the same layer so that the normalized design of the display panel 10 can be ensured. Moreover, the source connection portion 521 and the drain connection portion 522 are disposed in the same layer as the first active layer 211, that is, the source connection portion 521, the drain connection portion 522, and the first active layer 211 may be manufactured in one step, reducing the entire manufacturing cost of the display panel 10. In addition, a film used by the source connection portion 521 and the drain connection portion 522 does not need to be provided, that is, the film structure provided separately for the source connection portion 521 and the drain connection portion 522 can be reduced, thus facilitating a thinning design of the display panel 10 as a whole.

Figure 29:
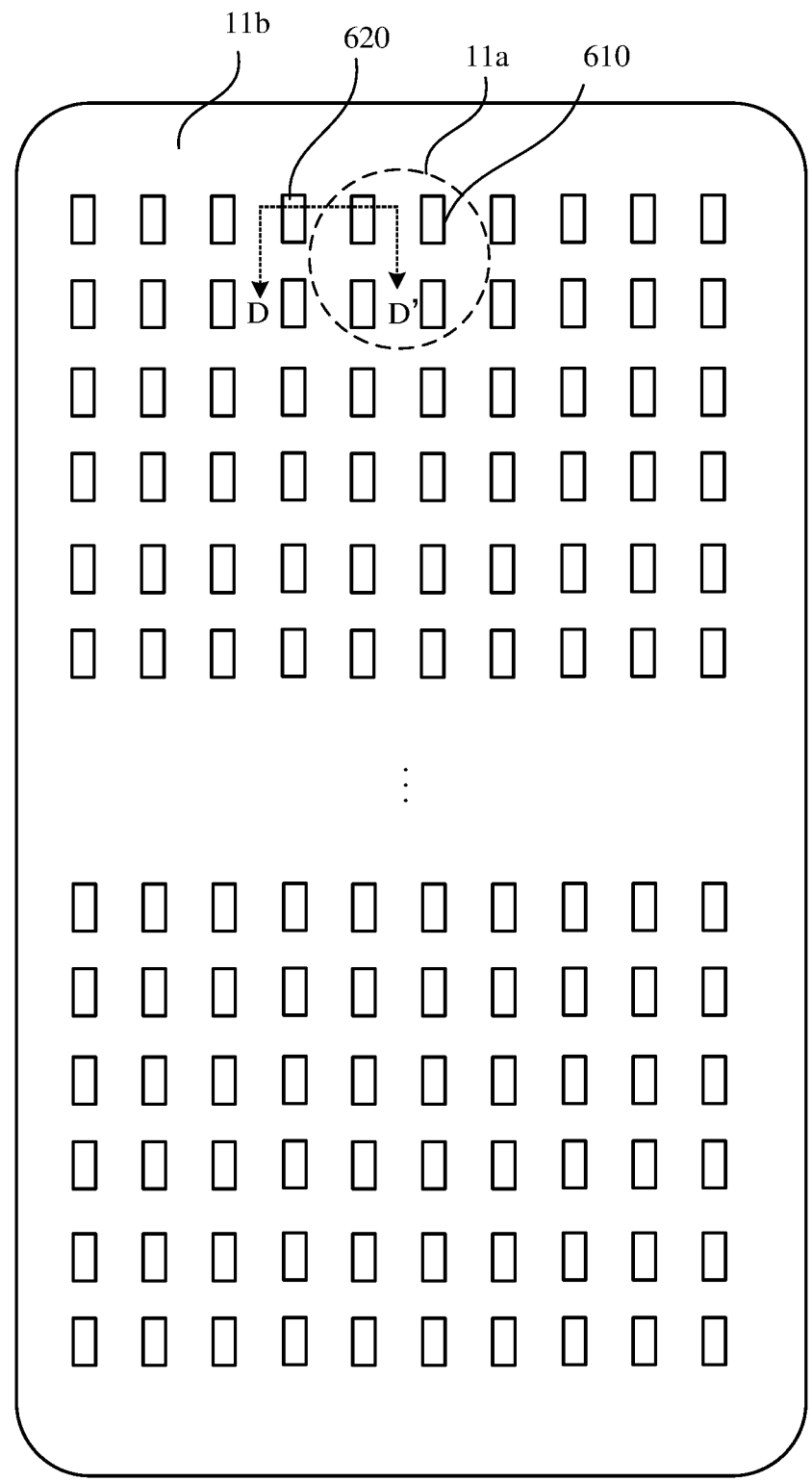
FIG. 29 is a schematic diagram illustrating the structure of another display panel according to an embodiment of the present disclosure.
Figure 30:
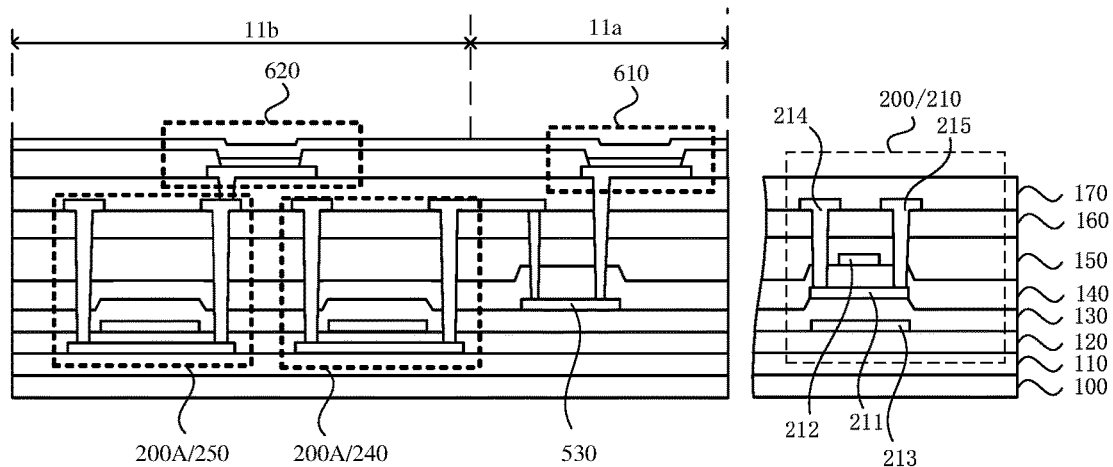
FIG. 30 is a section view taken along section line D-D' of FIG. 29.

FIG. 29 is a schematic diagram illustrating the structure of another display panel according to an embodiment of the present disclosure. FIG. 30 is a section view taken along section line D-D' of FIG. 29. Referring to FIGS. 29 and 30, the display panel 10 includes a first display region 11a and a second display region 11b, and the second display region 11b at least partially surrounds the first display region 11a. The first display region 11a includes a first light-emitting element 610, and the second display region 11b includes a second light-emitting element 620. The drive circuit 200 includes a first pixel circuit 240 and a second pixel circuit 250 located in the second display region 11b, the first pixel circuit 240 is electrically connected to the first light-emitting element 610 via a third connection structure 530, and the second pixel circuit 250 is electrically connected to the second light-emitting element 620. The third connection structure 530 is disposed in the same layer as the first active layer 211.

The display panel 10 includes a first display region 11a and a second display region 11b. The second display region 11b at least partially surrounds the first display region 11a. The first display region 11a may be a light-transmitting region in which an optical device is arranged below the display panel 10 for acquiring external light. Illustratively, the optical device 20 may be a camera under the screen or a fingerprint recognition module. The second display region 11b may be a normal display region of the display panel 10.

Further, the first display region 11a includes a first light-emitting element 610, and the second display region 11b includes a second light-emitting element 620. A comprehensive display effect of the display panel 10 is achieved by configuration of the first light-emitting element 610 and the second light-emitting element 620.

Further, referring to FIG. 30, a pixel circuit 200A for driving the first light-emitting element 610 is the first pixel circuit 240, and a pixel circuit 200A for driving the second light-emitting element 620 is the second pixel circuit 250. To ensure the light-transmitting effect of the first display region 11a, both the first pixel circuit 240 and the second pixel circuit 250 are disposed in the second display region 11b. Further, the first pixel circuit 240 disposed in the second display region 11b may be electrically connected to the first light-emitting element 610 via the third connection structure 530.

Further, referring to FIG. 30, the third connection structure 530 is disposed in the same layer as the first active layer 211 in the first transistor 210, that is, the third connection structure 530 and the first active layer 211 may be manufactured in one procedure, reducing the entire manufacturing cost of the display panel 10. In addition, a film used by the third connection structure 530 does not need to be provided, that is, the film structure provided separately for the third connection structure 530 can be reduced, thus facilitating a thinning design of the display panel 10 as a whole. It should be noted that the first transistor 210 shown in FIG. 30 is used for indicating that the third connection structure 530 is disposed in the same layer as first active layer 211, and the first transistor 210 is not in the section view taken along section line D-D'.

Figure 31:
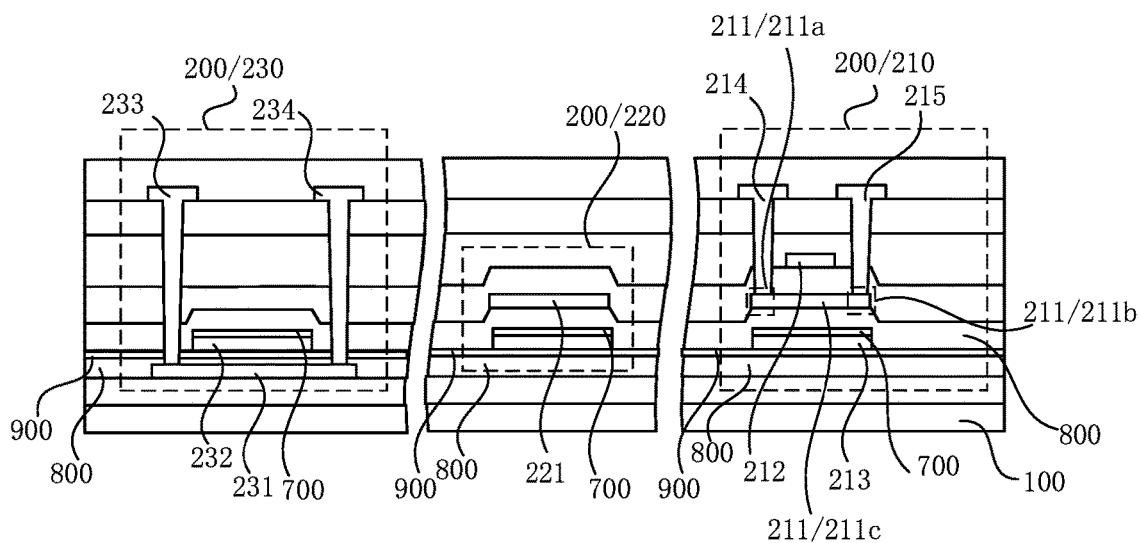
FIG. 31 is a schematic diagram illustrating the structure of another display panel according to an embodiment of the present disclosure.

FIG. 31 is a schematic diagram illustrating the structure of another display panel according to an embodiment of the present disclosure. As shown in FIG. 31, the first transistor 210 also includes a second gate 213 located on the side of the first active layer 211 adjacent to the substrate 100. The first active layer 211 includes a source region 211a, a drain region 211b, and a channel region 211c located between the source region 211a and the drain region 211b. The display panel 10 also includes a hydrogen barrier layer 700 located between a film in which the first active layer 211 is disposed and a film in which the second gate 213 is disposed, the hydrogen barrier layer 700 includes a metal layer and is in contact with the second gate 213, and the hydrogen barrier layer 700 overlaps at least the channel region 211c in the thickness direction of the display panel 10.

Referring to FIG. 31, the first transistor 210 may include a first gate 212 and a second gate 213, that is, the first transistor 210 is a double-gate transistor, and the first gate 212 is the top gate of the first transistor 210 and the second gate 213 is the bottom gate of the first transistor 210. Further, the first active layer 211 includes a source region 211a, a drain region 211b, and a channel region 211c located between the source region 211a and the drain region 211b. The source region 211a is a position at which the source 214 is electrically connected to the first active layer 211. The drain region 211b is a position at which the drain 215 is electrically connected to the first active layer 211. The channel region 211c is a region in which the first gate 212 and the second gate 213 overlap at the first active layer 211 in the thickness direction of the display panel 10.

Further, the display panel 10 also includes a hydrogen barrier layer 700 disposed in contact with the second gate 213. The provided hydrogen barrier layer 700 may prevent hydrogen from transmitting to the channel region 211c, thus avoiding a threshold drift of the first transistor 210 and ensuring the operational stability of the first transistor 210. In an embodiment, the hydrogen barrier layer 700 includes a metal layer. Illustratively, the material of the hydrogen barrier layer 700 may be titanium metal. In terms of the hydrogen barrier layer of silicon nitride, although silicon nitride does not contain hydrogen, hydrogen is also generated in the manufacturing process of the silicon nitride. That is, if the hydrogen barrier layer of silicon nitride is used, a certain impact is imposed on the threshold stability of the first transistor 210. Thus, the hydrogen barrier layer 700 of metal has a more stable structure and better ensures the threshold stability of the first transistor 210.

Alternatively, the enthalpy value of the hydrogen barrier layer 700 is negative.

In an embodiment, the enthalpy value of the hydrogen barrier layer 700 is adjusted to a negative value. In this manner, it is ensured that the hydrogen barrier layer 700 has a stable structure, the hydrogen barrier function is stable, and the overall display panel 10 is stable.

With continued reference to FIG. 31, the display panel 10 also includes an isolation layer 800 disposed between the film in which the first active layer 211 is disposed and a film in which the hydrogen barrier layer 700 is disposed, the isolation layer 800 is in contact with the hydrogen barrier layer 700 and the first active layer 211 separately, and the isolation layer 800 includes silicon oxide.

Further, the display panel 10 is provided with an isolation layer 800 disposed between the first active layer 21 and the hydrogen barrier layer 700, through which the effect of hydrogen on the threshold of the first transistor 210 can be more effectively prevented. Thus, the threshold stability of the first transistor 210 can be further ensured.

Referring to FIG. 31, the drive circuit 200 also includes a second transistor 230, the second transistor 230 includes a second active layer 231 and a third gate 232, the second active layer 231 includes silicon, and the third gate 232 is located on the side of the second active layer 231 away from the substrate 100. The display panel 10 also includes a hydrogen injection layer 900 located between a film in which the second active layer 231 is disposed and a film in which the third gate 232 is disposed.

In an embodiment, the second active layer 231 of the second transistor 230 includes silicon, that is, a hydrogenation process exists in manufacturing the second active layer 231. To ensure the hydrogenation process of the second transistor 230, the hydrogen injection layer 900 is disposed on the side of the third gate 232 of the second transistor 230 adjacent to the second active layer 231. Further, the configuration position of the hydrogen injection layer 900 ensures the hydrogenation process of the second transistor 230 without transmitting hydrogen to the first active layer 211 of the first transistor 210, that is, the threshold stability of the first transistor 210 is also ensured.

Figure 32:
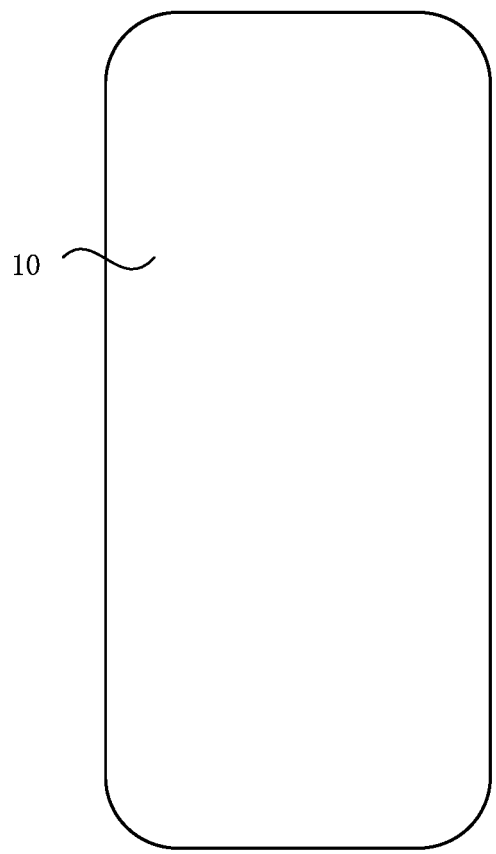
FIG. 32 is a schematic diagram illustrating the structure of a display device according to an embodiment of the present disclosure.

Based on the same inventive concept, an embodiment of the present disclosure also provides a display device. FIG. 32 is a schematic diagram illustrating the structure of a display device according to an embodiment of the present disclosure. The display device includes any one of the display panels provided in the preceding embodiments. Illustratively, referring to FIG. 32, the display device 1 includes the display panel 10. Therefore, the display device also has the beneficial effects of the display panel described in the preceding embodiments. The same content may be understood by reference to the preceding description of the display panel, and repetition is not made below.

The display device 1 provided in this embodiment of the present disclosure may be a phone shown in FIG. 32, or may be any electronic product with a display function, including but not limited to a television, a laptop, a desktop display, a tablet computer, a digital camera, a smart bracelet, smart glasses, an in-vehicle display, industry-controlling equipment, a medical display, a touch interactive terminal, and the like, which is not limited in embodiments of the present disclosure.

It is to be noted that the preceding are only alternative embodiments of the present disclosure and the technical principles used therein. It is to be understood by those skilled in the art that the present disclosure is not limited to the embodiments described herein. For those skilled in the art, various apparent modifications, adaptations, and substitutions may be made without departing from the scope of the present disclosure. Therefore, while the present disclosure is described in detail via the preceding embodiments, the present disclosure is not limited to the preceding embodiments and may include more equivalent embodiments without departing from the concept of the present disclosure. The scope of the present disclosure is determined by the scope of the appended claims.

What is claimed is:

1. A display panel, comprising a substrate and a drive circuit located on one side of the substrate; wherein
the drive circuit comprises a first transistor, the first transistor comprises a first active layer, and the first active layer comprises an oxide semiconductor; and
the drive circuit further comprises a first capacitor, and one capacitor plate of the first capacitor is disposed in a same layer as the first active layer;
wherein the drive circuit comprises a pixel circuit, the pixel circuit comprises a data writing transistor, a drive transistor, and a node potential adjustment capacitor, wherein the node potential adjustment capacitor is disposed in series between a gate of the data writing transistor and a gate of the drive transistor; and the first capacitor comprises the node potential adjustment capacitor.

2. The display panel of claim 1, wherein the pixel circuit further comprises a storage capacitor, one capacitor plate of the storage capacitor is electrically connected to a power signal terminal;
the first capacitor further comprises the storage capacitor; and
the first transistor further comprises a first gate located on a side of the first active layer away from the substrate, and one capacitor plate of the node potential adjustment capacitor is disposed in a same layer as the first gate.

3. The display panel of claim 1, wherein the drive circuit further comprises a shift register circuit, the shift register circuit comprises a bootstrap capacitor and an output transistor, one terminal of the bootstrap capacitor is electrically connected to an output terminal of the shift register circuit, and another terminal of the bootstrap capacitor is electrically connected to a gate of the output transistor;
the first transistor further comprises a first gate located on a side of the first active layer away from the substrate; and
the first capacitor further comprises the bootstrap capacitor, one capacitor plate of the bootstrap capacitor is disposed in a same layer as the first active layer, and another capacitor plate of the bootstrap capacitor is disposed in a same layer as the first gate.

4. The display panel of claim 1, wherein the pixel circuit further comprises a light-emitting control transistor, an initialization transistor, and a bias adjustment transistor;
the display panel further comprises a light-emitting control signal line, an initialization signal line, and a bias adjustment signal line, wherein the light-emitting control signal line is electrically connected to a gate of the light-emitting control transistor, the initialization signal line is electrically connected to an input terminal of the initialization transistor, and the bias adjustment signal line is electrically connected to an input terminal of the bias adjustment transistor; and
at least one of the light-emitting control signal line, the initialization signal line, or the bias adjustment signal line is disposed in a same layer as the first active layer.

5. The display panel of claim 1, wherein the display panel further comprises a fan-out wire region and a fan-out wire located in the fan-out wire region; and
the fan-out wire comprises at least one layer of wire structures, and at least a portion of the fan-out wire is disposed in a same layer as the first active layer.

6. The display panel of claim 1, wherein the pixel circuit further comprises a threshold compensation transistor, and an output terminal of the threshold compensation transistor is electrically connected to the gate of the drive transistor via a first connection structure; and
the first connection structure is disposed in a same layer as the first active layer.

7. The display panel of claim 1, wherein the drive circuit further comprises second transistors, one of the second transistors comprises a second active layer, and the second active layer comprises silicon; and
the display panel further comprises a second connection structure, a source and a drain of at least a portion of the second transistors are electrically connected to the second active layer via the second connection structure, and the second connection structure is disposed in a same layer as the first active layer.

8. The display panel of claim 7, wherein the second transistor comprises a switch transistor and a drive transistor; and
at least a source and a drain of the switch transistor are electrically connected to the second active layer via the second connection structure.

9. The display panel of claim 7, wherein the drive circuit further comprises a shift register circuit; and
the source and the drain of the second transistor in the shift register circuit are electrically connected to the second active layer via the second connection structure.

10. The display panel of claim 1, wherein the drive circuit further comprises a second transistor, the second transistor comprises a second active layer, a source, and a drain, the second active layer comprises silicon, and the source and the drain are both electrically connected to the second active layer; wherein
- the source comprises a first source portion and a second source portion, the first source portion is located on a side of the second source portion adjacent to the second active layer, the first source portion comprises a first source surface adjacent to one side of the second source portion, and the second source portion comprises a second source surface adjacent to one side of the first source portion;
- the drain comprises a first drain portion and a second drain portion, the first drain portion is located on a side of the second drain portion adjacent to the second active layer, the first drain portion comprises a first drain surface adjacent to one side of the second drain portion, and the second drain portion comprises a second drain surface adjacent to one side of the first drain portion; and
- the display panel further comprises at least one of a source connection portion or a drain connection portion, wherein the source connection portion is located between a film in which the first source portion is disposed and a film in which the second source portion is disposed, the source connection portion is electrically connected to the first source portion and the second source portion separately, and an area of the source connection portion is larger than both an area of the first source surface and an area of the second source surface; the drain connection portion is located between a film in which the first drain portion is disposed and a film in which the second drain portion is disposed, the drain connection portion is electrically connected to the first drain portion and the second drain portion separately, and an area of the drain connection portion is larger than both an area of the first drain surface and an area of the second drain surface.

11. The display panel of claim 10, wherein the source connection portion and the drain connection portion are both disposed in a same layer as the first active layer.

12. The display panel of claim 1, wherein the display panel comprises a first display region and a second display region, and the second display region at least partially surrounds the first display region; wherein
- the first display region comprises a first light-emitting element, and the second display region comprises a second light-emitting element;
- the pixel circuit comprises a first pixel circuit and a second pixel circuit which are located in the second display region, the first pixel circuit is electrically connected to the first light-emitting element via a third connection structure, and the second pixel circuit is electrically connected to the second light-emitting element; and
- the third connection structure is disposed in a same layer as the first active layer.

13. The display panel of claim 1, wherein the first transistor further comprises a second gate located on a side of the first active layer adjacent to the substrate;
- the first active layer comprises a source region, a drain region, and a channel region located between the source region and the drain region;
- the display panel further comprises a hydrogen barrier layer located between a film in which the first active layer is disposed and a film in which the second gate is disposed, and the hydrogen barrier layer comprises a metal layer and is in contact with the second gate; and
- the hydrogen barrier layer overlaps at least the channel region in a thickness direction of the display panel.

14. The display panel of claim 13, wherein an enthalpy value of the hydrogen barrier layer is negative.

15. The display panel of claim 13, wherein the display panel further comprises an isolation layer located between the film in which the first active layer is disposed and a film in which the hydrogen barrier layer is disposed, the isolation layer is in contact with the hydrogen barrier layer and the first active layer separately, and the isolation layer comprises silicon oxide.

16. The display panel of claim 13, wherein the drive circuit further comprises a second transistor, the second transistor comprises a second active layer and a third gate, the second active layer comprises silicon, and the third gate is located on a side of the second active layer away from the substrate; and
- the display panel further comprises a hydrogen injection layer located between a film in which the second active layer is disposed and a film in which the third gate is disposed.

17. A display device, comprising a display panel, wherein the display panel comprises a substrate and a drive circuit located on one side of the substrate; wherein the drive circuit comprises a first transistor, the first transistor comprises a first active layer, and the first active layer comprises an oxide semiconductor; and the drive circuit further comprises a first capacitor, and one capacitor plate of the first capacitor is disposed in a same layer as the first active layer;
- wherein the drive circuit comprises a pixel circuit, the pixel circuit comprises a data writing transistor, a drive transistor, and a node potential adjustment capacitor, wherein the node potential adjustment capacitor is disposed in series between a gate of the data writing transistor and a gate of the drive transistor; and the first capacitor comprises the node potential adjustment capacitor.

18. The display device of claim 17, wherein the pixel circuit further comprises a storage capacitor, one capacitor plate of the storage capacitor is electrically connected to a power signal terminal;
- the first capacitor further comprises the storage capacitor; and
- the first transistor further comprises a first gate located on a side of the first active layer away from the substrate, and one capacitor plate of the node potential adjustment capacitor is disposed in a same layer as the first gate.

19. The display device of claim 17, wherein the drive circuit further comprises a shift register circuit, the shift register circuit comprises a bootstrap capacitor and an output transistor, one terminal of the bootstrap capacitor is electrically connected to an output terminal of the shift register circuit, and another terminal of the bootstrap capacitor is electrically connected to a gate of the output transistor;
- the first transistor further comprises a first gate located on a side of the first active layer away from the substrate; and
- the first capacitor further comprises the bootstrap capacitor, one capacitor plate of the bootstrap capacitor is disposed in a same layer as the first active layer, and another capacitor plate of the bootstrap capacitor is disposed in a same layer as the first gate.

20. The display device of claim 17, wherein the pixel circuit further comprises a light-emitting control transistor, an initialization transistor, and a bias adjustment transistor;

the display panel further comprises a light-emitting control signal line, an initialization signal line, and a bias adjustment signal line, wherein the light-emitting control signal line is electrically connected to a gate of the light-emitting control transistor, the initialization signal line is electrically connected to an input terminal of the initialization transistor, and the bias adjustment signal line is electrically connected to an input terminal of the bias adjustment transistor; and at least one of the light-emitting control signal line, the initialization signal line, or the bias adjustment signal line is disposed in a same layer as the first active layer.

* * * * *